(12) United States Patent
Miyachi et al.

(10) Patent No.: US 7,079,563 B2
(45) Date of Patent: Jul. 18, 2006

(54) SEMICONDUCTOR LASER DEVICE AND METHOD OF MANUFACTURING THE SAME

(75) Inventors: Mamoru Miyachi, Saitama-ken (JP); Atsushi Watanabe, Saitama-ken (JP); Hirokazu Takahashi, Saitama-ken (JP); Yoshinori Kimura, Saitama-ken (JP)

(73) Assignee: Pioneer Corporation, Tokyo (JP)

( * ) Notice: Subject to any disclaimer, the term of this patent is extended or adjusted under 35 U.S.C. 154(b) by 252 days.

(21) Appl. No.: 10/743,944

(22) Filed: Dec. 24, 2003

(65) Prior Publication Data

US 2004/0136428 A1 Jul. 15, 2004

(30) Foreign Application Priority Data

Dec. 25, 2002 (JP) ............................. 2002-374636

(51) Int. Cl.
*H01S 5/00* (2006.01)
(52) U.S. Cl. ............................. 372/50.12; 372/50.121; 372/50.1
(58) Field of Classification Search ............. 372/50.12, 372/50.1, 50.121
See application file for complete search history.

(56) References Cited

U.S. PATENT DOCUMENTS

| | | | | |
|---|---|---|---|---|
| 4,399,541 A | * | 8/1983 | Kovats et al. ................ | 372/36 |
| 5,920,766 A | | 7/1999 | Floyd | |
| 6,031,858 A | * | 2/2000 | Hatakoshi et al. ....... | 372/46.01 |
| 6,252,896 B1 | * | 6/2001 | Tan et al. ................. | 372/50.11 |
| 6,282,220 B1 | * | 8/2001 | Floyd ......................... | 372/50.1 |
| 6,661,824 B1 | * | 12/2003 | Onishi ....................... | 372/50.1 |

FOREIGN PATENT DOCUMENTS

| | | |
|---|---|---|
| EP | 11-112091 | 4/1999 |
| EP | 11-298093 | 10/1999 |
| EP | 0 957 548 A2 | 11/1999 |
| EP | 2002-043697 | 2/2002 |
| JP | 2001-230502 | 8/2001 |
| JP | 2002-179229 | 6/2002 |

OTHER PUBLICATIONS

European Search Report.

* cited by examiner

*Primary Examiner*—Minsun Harvey
*Assistant Examiner*—Ernest Unelus
(74) *Attorney, Agent, or Firm*—Arent Fox PLLC

(57) ABSTRACT

An improved semiconductor laser device is provided which has a small distance between laser light emitting spots. Such laser device comprises i) a first light emitting element including a laser oscillation section provided with a ridge waveguide and formed by forming a group-III nitride semiconductor film on a substrate, an insulating layer and an ohmic electrode layer, ii) a second light emitting element including a laser oscillation section provided with a waveguide and formed by forming III–V compound semiconductor film, an insulating layer and an ohmic electrode layer. By virtue of the adhesive metal layer interposed between the two ohmic electrode layers, the two laser oscillation sections are combined together, thereby forming the improved semiconductor laser device which has a small distance between laser light emitting spots of the two laser oscillation sections.

32 Claims, 14 Drawing Sheets

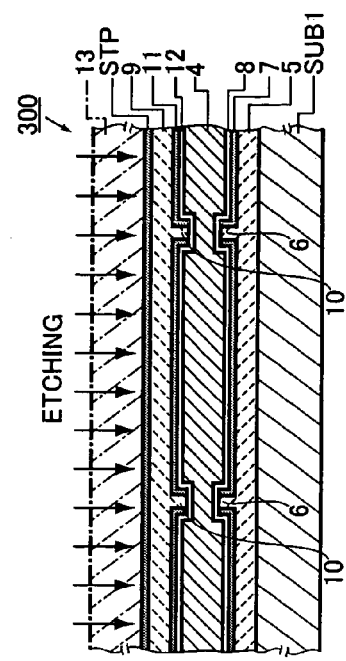
FIG.2 A
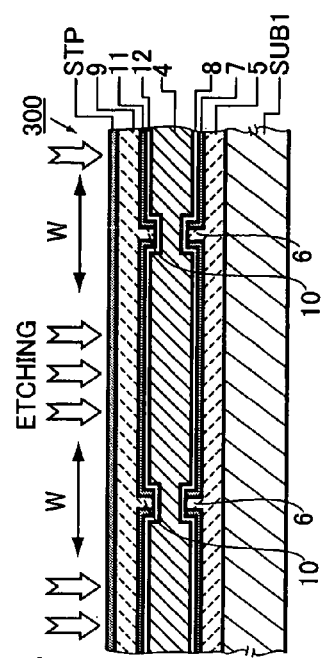
FIG.2 B
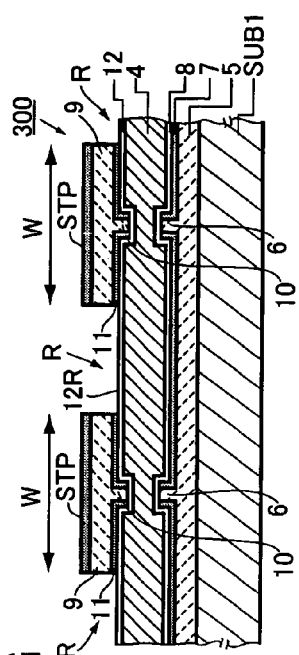
FIG.2 C
FIG.2 D
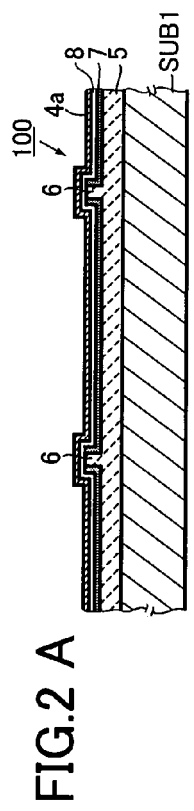
FIG.2 E
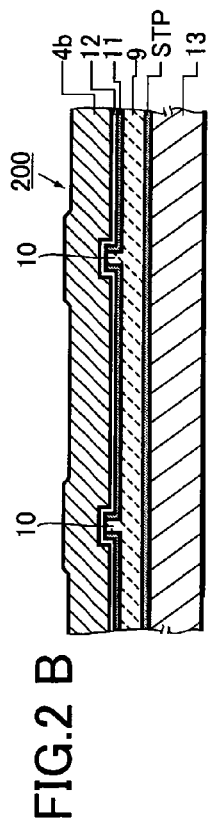
FIG.2 F
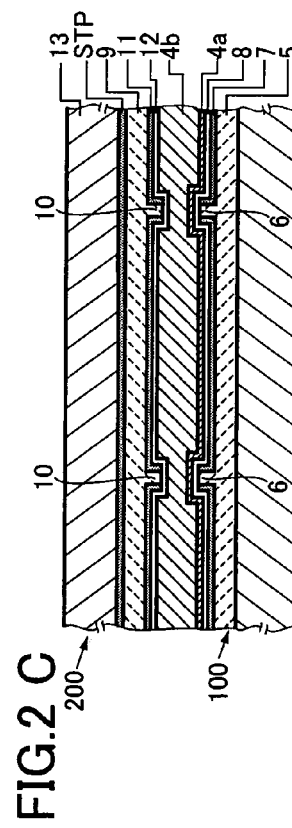
FIG.2 G
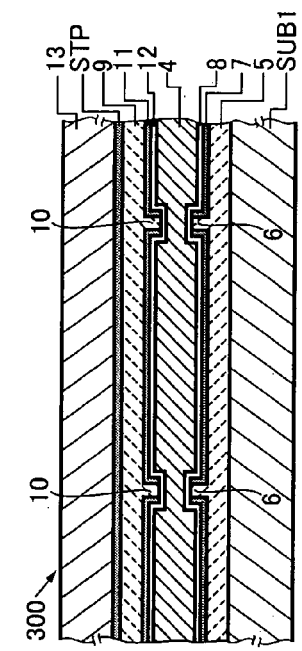

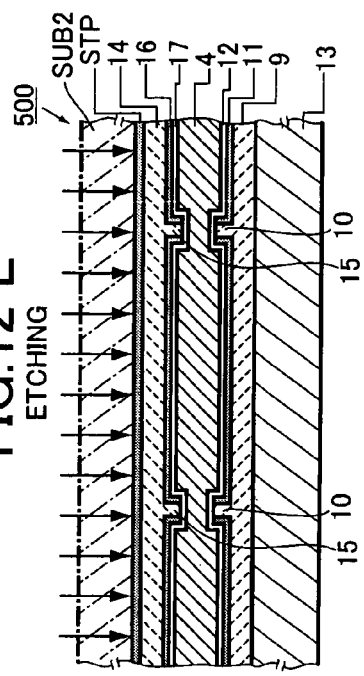
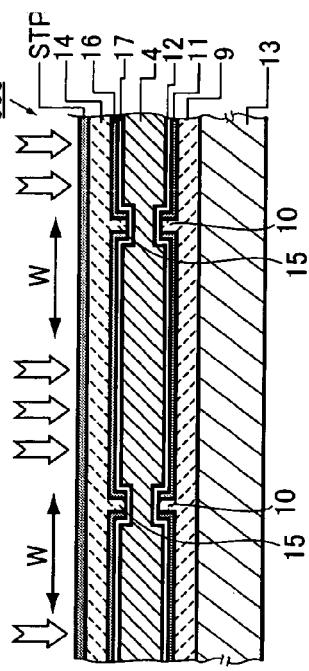
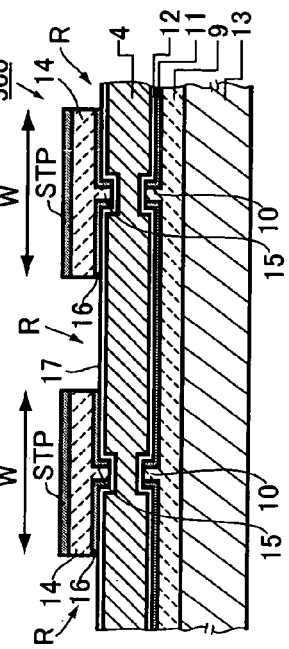
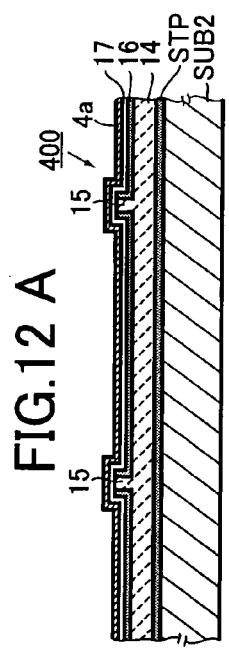
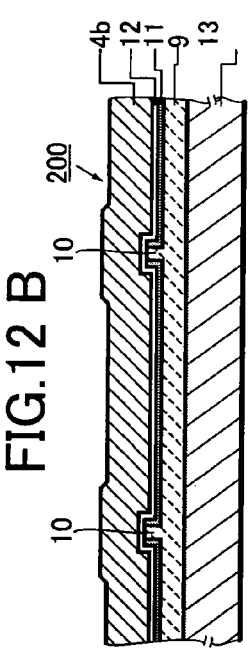
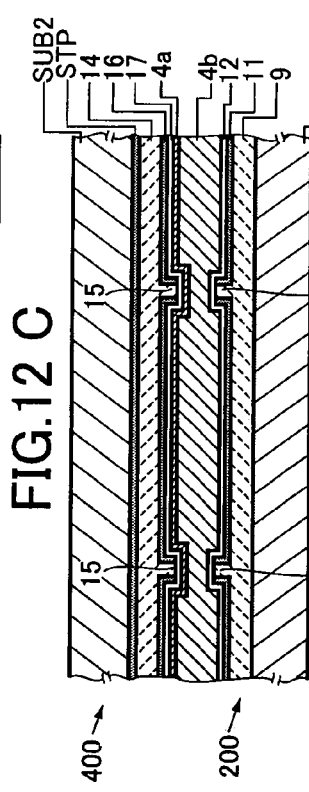
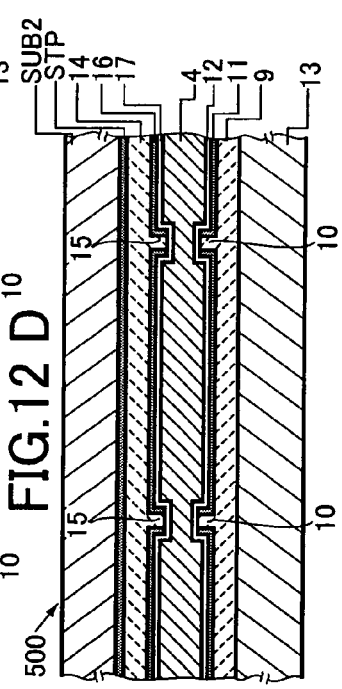

SEMICONDUCTOR LASER DEVICE AND METHOD OF MANUFACTURING THE SAME

BACKGROUND OF THE INVENTION

The present invention relates to a semiconductor laser device capable of emitting a plurality of laser beams having different wavelengths.

The present application claims priority from Japanese Application No. 2002-374636, the disclosure of which is incorporated herein by reference.

In recent years, development and research have been carried out on semiconductor laser device called multiple wavelength laser which is capable of emitting a plurality of laser beams having different wavelengths.

For example, in the field of data recording and playback systems for optical storage medium represented by CD (Compact Disc) and DVD (Digital Versatile Disc), if it is desired to develop an optical pickup compatible with various storage media, it is important to develop a semiconductor laser device capable of emitting a plurality of laser beams having different wavelengths.

In order to solve some difficulties in realizing the multiple-wavelength laser diode produced by monolithic integration technique, it has been suggested that a hybrid structure be used to achieve the same purpose (for example, patent document 1).

A semiconductor laser device disclosed in patent document 1, as shown in FIG. 1 of the patent document, comprises a first light emitting element which is formed on a first substrate and has a GaN-based laser oscillation section capable of emitting a short wavelength (for example, about 400 nm) laser beam, and a second light emitting element which is formed on a second substrate and has an AlGaInP-based laser oscillation section and an AlGaAs-based laser oscillation section capable of emitting a long wavelength (for example, from about 600 nm to about 700 nm) laser beam. The first and second light emitting elements are fabricated independently from each other and in the form of chips, with one being laid above the other on the support substrate (so called sub-mount), thereby forming a hybrid structure.

Here, the first light emitting element is attached to the support substrate and the second light emitting element is attached to the first light emitting element.

In detail, since the GaN-based laser oscillation section provided on the first substrate is attached such that it is interposed between the first substrate and the support substrate, the first light emitting element can be attached to the support substrate. Further, since an AlGaInP-based laser oscillation section and an AlGaAs-based laser oscillation section provided on the second substrate are attached such that they are interposed between the second substrate and the first substrate, the second light emitting element can be attached to the first substrate.

Namely, the GaN-based laser oscillation section, the first substrate, the AlGaInP-based laser oscillation section, the AlGaAs-based laser oscillation section and the second substrate are successsively laid in such an order on the support substrate, thereby forming a multilayer structure.

The patent document 1 shows that a pickup which has a compatibility with various storage media can be realized if such semiconductor laser device is used as a light source for optical pickup.

However, since the above-described conventional semiconductor laser device is so formed that the first light emitting element and the second light emitting element are fabricated in advance as independent semiconductor chips, and since the first and second light emitting elements in the form of chips are stacked one over another on the support substrate (sub-mount) and thus an overlapped structure is formed, there have been existing the following problems.

Namely, when manufacturing a semiconductor laser device for use in an optical pickup, in order to adjust the emission direction of a laser beam emitted from a cleaved facet of each light emitting element, it is necessary to attach each chipped light emitting element by positioning the same with an extremely high precision, hence requiring an extremely complex process of manufacturing respective semiconductor laser devices.

Furthermore, in the conventional semiconductor laser device, the first light emitting element has a structure in which GaN-based laser oscillation section is formed on the first substrate, while the second light emitting element has a structure in which AlGaInP-based laser oscillation section and AlGaAs-based laser oscillation section are formed on the second substrate. Then, since GaN-based laser oscillation section is attached to the support substrate, the first substrate is positioned on the upper side of GaN-based laser oscillation section, while AlGaInP-based laser oscillation section and AlGaAs-based laser oscillation section are positioned on the upper side of the first substrate, while the second substrate is positioned on the upper sides of the AlGaInP-based laser oscillation section and AlGaAs-based laser oscillation section.

Namely, the first substrate is disposed between the GaN-based laser oscillation section on one side and the AlGaInP-based laser oscillation section as well as AlGaAs-based laser oscillation section on the other.

However, as described in the above patent document 1, in the aforementioned structure, since the first substrate (GaN substrate) usually has a thickness of 100 μm, there is a problem that a large interval is formed between an emission position (light emitting spot) of laser beam of GaN-based laser oscillation section and another emission position (light emitting spot) of laser beams of the AlGaInP-based laser oscillation section and AlGaAs-based laser oscillation section. Namely, there is a problem that an interval between the respective light emitting spots of the respective laser beams is large.

For example, when this semiconductor laser device is mounted on an optical pickup to perform information recording or reproducing, if an emission position (light emitting spot) of GaN-based laser oscillation section is aligned in its optical axis with the optical axis of an optical system forming the optical pickup, emission positions (light emitting spots) of the AlGaInP-based laser oscillation section and AlGaAs-based laser oscillation section will greatly deviate from the optical axis center of the optical system due to an influence of the thickness of the first substrate, hence causing some troubles such as aberration.

Moreover, for example, if an optical element such as a prism is provided for eliminating some unfavorable influences caused by the thickness of the first substrate in order that laser beam emitted by the GaN-based laser oscillation section as well as the laser beams emitted by the AlGaInP-based laser oscillation section and the AlGaAs-based laser oscillation section may all become coincident with the optical axis of the optical system of the optical pickup, another problem will occur that the number of parts will have to be increased.

SUMMARY OF THE INVENTION

This invention has been accomplished in view of the above-discussed problems, and it is an object of the invention to provide an improved semiconductor laser device capable of emitting a plurality of laser beams having different wavelengths and having small interval(s) between laser beam emitting spots. Another object of the present invention is to provide a method of manufacturing such an improved semiconductor laser device.

It is a further object of the invention to provide an improved semiconductor laser device which can be easily manufactured and in which interval(s) between laser beam emitting spots have been adjusted with a high precision. A still further object of the present invention is to provide a method of manufacturing such an improved semiconductor laser device.

One more object of the present invention is to provide an improved semiconductor laser device having some new functions failed to be equipped in a conventional semiconductor laser device, and to provide a method of manufacturing the same.

According to a first aspect of the present invention, there is provided a semiconductor laser device capable of emitting a plurality of laser beams having different wavelengths, the device comprising: a first laser oscillation section formed on a semiconductor substrate and having a predetermined specific area; and a second laser oscillation section having a smaller specific area than the first laser oscillation section. Specifically, the first laser oscillation section's one surface located away from the semiconductor substrate and the second laser oscillation section's one surface located close to its light emitting portion are bonded together by virtue of an adhesion layer having an electric conductivity. In particular, the second laser oscillation section includes III–V compound semiconductor containing any one of arsenic (As), phosphorus (P) and antimony (Sb) as group V element or II–VI compound semiconductor.

According to a second aspect of the present invention, there is provided a method of manufacturing a semiconductor laser device capable of emitting a plurality of laser beams having different wavelengths, the method comprising the steps of: forming a plurality of semiconductor films on a first semiconductor substrate to form a first laser oscillation section, while at the same time forming a first adhesion layer having an electric conductivity on the first laser oscillation section having a multilayer structure formed by the plurality of semiconductor films, thereby forming a first intermediate body; forming an etching stop layer on a second semiconductor substrate, while at the same time forming a plurality of semiconductor films on the etching stop layer to form a second laser oscillation section, followed by forming a second adhesion layer having an electric conductivity on the second laser oscillation section having a multilayer structure formed by the plurality of semiconductor films, thereby forming a second intermediate body; bonding together the first adhesion layer and the second adhesion layer to form a third intermediate body in which the first laser oscillation section and the second laser oscillation section have been bonded together; performing an etching treatment on the third intermediate body to remove the second semiconductor substrate portions from the third intermediate body, and to remove portions of the second laser oscillation section except those in which waveguide is formed, thereby forming a plurality of second laser oscillation sections; and removing remaining portions of the etching stop layer and cleaving the third intermediate body to divide the third intermediate body along recess portions formed on both sides of each of the second laser oscillation sections, thereby forming a plurality of semiconductor laser devices each including a first laser oscillation section and a second laser oscillation section which are secured together with the adhesion layer interposed therebetween.

According to a third aspect of the present invention, there is provided a method of manufacturing a semiconductor laser device capable of emitting a plurality of laser beams having different wavelengths, the method comprising the steps of: forming a plurality of semiconductor films on a first semiconductor substrate to form a first laser oscillation section, while at the same time forming a first adhesion layer having an electric conductivity on the first laser oscillation section having a multilayer structure formed by the plurality of semiconductor films, thereby forming a first intermediate body; forming an etching stop layer on a second semiconductor substrate, then forming a plurality of semiconductor films on the etching stop layer to form a second laser oscillation section, while at the same time forming a plurality of semiconductor films to form a third laser oscillation section, thereby forming second and third laser oscillation sections in mutually separated positions, followed by forming a second adhesion layer having an electric conductivity on the second and third laser oscillation sections, thereby forming a second intermediate body; bonding together the first adhesion layer and the second adhesion layer to form a third intermediate body in which the first, second and third laser oscillation sections have been bonded together; performing an etching treatment on the third intermediate body to remove the second semiconductor substrate portions from the third intermediate body, and to remove portions of the second and third laser oscillation sections except those in which waveguides are formed, thereby forming a plurality of second and third laser oscillation sections; removing remaining portions of the etching stop layer and cleaving the third intermediate body to divide the third intermediate body along recess portions formed on both sides of each of the second and third laser oscillation sections, thereby forming a plurality of semiconductor laser devices each including a first laser oscillation section, a second laser oscillation section and a third laser oscillation section which are secured together with the adhesion layers interposed therebetween.

BRIEF DESCRIPTION OF THE DRAWINGS

These and other objects and advantages of the present invention will become clear from the following description with reference to the accompanying drawings, wherein:

FIGS. 2A–2G are cross sectional views showing a process of manufacturing the semiconductor laser device of the first embodiment.

FIGS. 12A–12G are cross sectional views showing a process of manufacturing the semiconductor laser device of the third embodiment.

DETAILED DESCRIPTION OF THE PREFERRED EMBODIMENTS

Hereafter, several preferred embodiments of the present invention will be described with reference to the accompanying drawings.

[First Embodiment]

A semiconductor laser device according to a first embodiment of the present invention will be described with reference to FIGS. 1 to 4.

Figure 3:
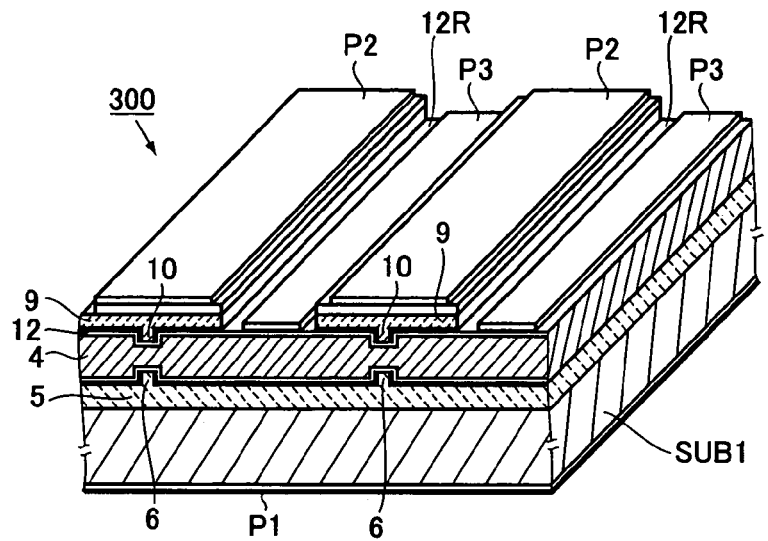
FIGS. 3A–3C are perspective views showing the manufacturing process to be continued after the process shown in FIGS. 2A–2G.
Figure 3:
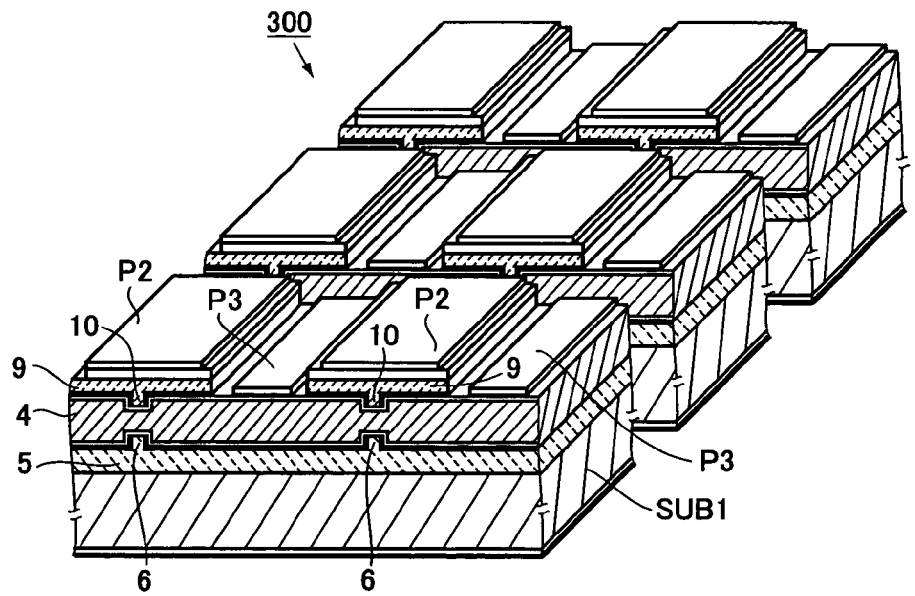
Figure 3:
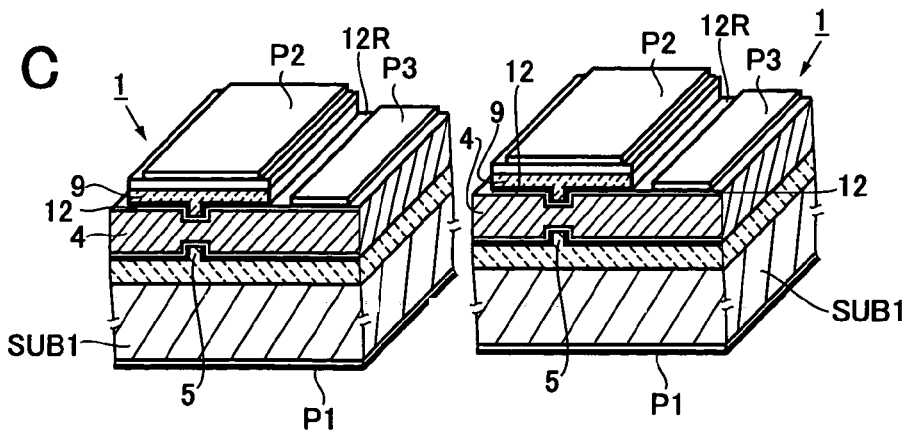
Figure 4:
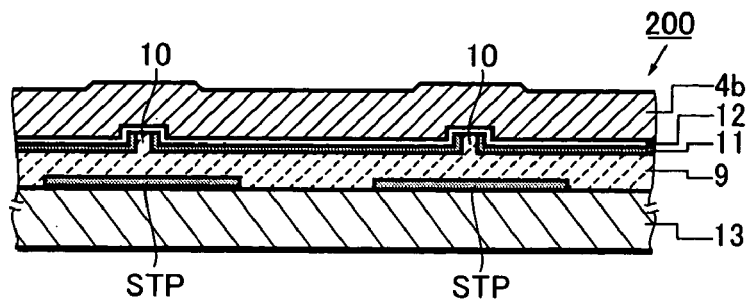
FIGS. 4A–4C are cross sectional views showing another process of manufacturing the semiconductor laser device of the first embodiment.
Figure 4:
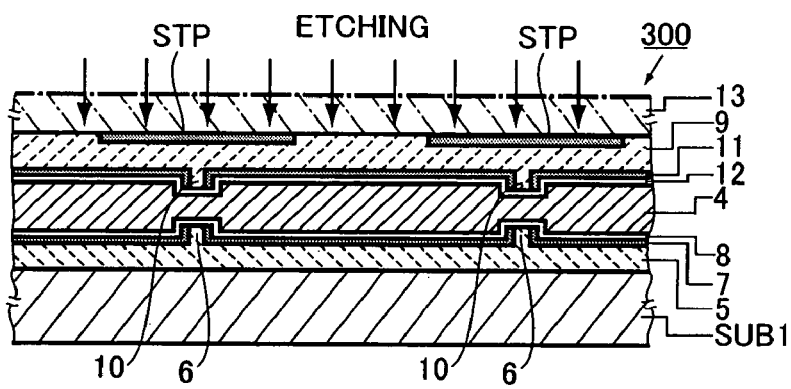
Figure 4:
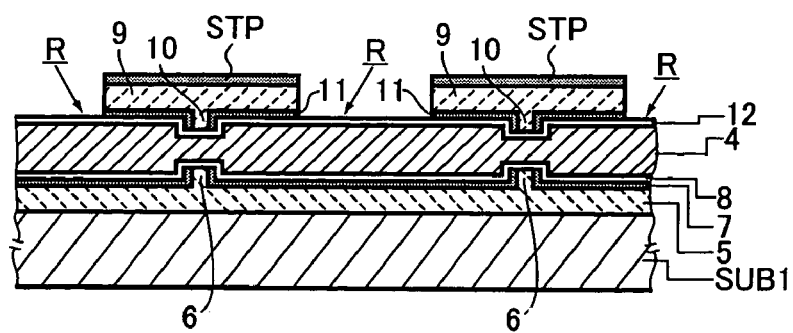

FIG. 1A is a perspective view showing an external configuration of the semiconductor laser device, FIG. 1B is a view showing a cross-sectional configuration of the semiconductor laser device shown in the FIG. 1A. FIGS. 2, 3 and 4 are views showing a process of manufacturing the semiconductor laser device.

As shown in FIGS. 1A and 1B, the semiconductor laser device 1 has a hybrid structure which includes a first light emitting element 2 and a second light emitting element 3 integrally fixed together by virtue of an adhesive metal layer 4 serving as an adhesion layer and having an electrical conductivity. Here, the first light emitting element 2 is capable of emitting a short wavelength laser beam (for example, about 400 nm) and the second light emitting element 3 is capable of emitting a long wavelength laser beam (for example, from about 600 nm to about 700 nm).

The first light emitting element 2 is formed on a semiconductor substrate SUB 1 consisting of group-III nitride semiconductor and comprises a laser oscillation section 5 having a ridge waveguide 6, an insulating layer 7 covering the top face of the laser oscillation section 5 except for the ridge waveguide 6, and an ohmic electrode layer 8 electrically connected to the ridge waveguide 6 and laminated on the insulating layer 7.

Moreover, the ohmic electrode layer 8 and the adhesive metal layer 4 serving as an adhesive layer are connected together electrically and mechanically, while an ohmic electrode P1 is formed on the backside of the semiconductor substrate SUB 1.

Here, the laser oscillation section 5 includes a double hetero (DH) structure having two clad layers laminated together to enclose an active layer of a multiple quantum well structure and the above-mentioned ridge waveguide 6 formed on the adhesive metal layer 4 side, by virtue of an arrangement in which a plurality of semiconductor thin films consisting of group-III nitride semiconductors (for example, GaN-based semiconductors) are laminated on the semiconductor substrate SUB 1.

The second light emitting element 3 has a structure in which a plurality of III–V compound semiconductor layers containing arsenic (As), phosphorus (P) or antimony (Sb) as group V element are laminated, and comprises a laser oscillation section 9 having a ridge waveguide 10, an insulating layer 11 covering the entire surface of the adhesive metal layer 4 of the laser oscillation section 9 except for the ridge waveguide 10, and an ohmic electrode layer 12 electrically connected to the ridge waveguide 10 and laminated on the insulating layer 11.

Here, the laser oscillation section 9 includes a double hetero (DH) structure having two clad layers laminated together to enclose an active layer of a strained multiple quantum well structure containing at least phosphorus (P) and also includes the above-mentioned ridge waveguide 10 formed on the adhesive metal layer 4 side.

Moreover, the ohmic electrode layer 12 and the adhesive metal layer 4 serving as an adhesive layer are connected together electrically and mechanically, while an ohmic electrode P2 is formed on the surface of the laser oscillation section 9.

Furthermore, as shown in FIGS. 1A and 1B, as compared with the specific area of the laser oscillation section 5 of the first light emitting element 2 adhered to the adhesive metal layer 4, the specific area of the laser oscillation section 9 of the second light emitting element 3 adhered to the adhesive metal layer 4 is relatively small. Because of the difference between the specific areas of the laser oscillation sections 5 and 9, the adhesive metal layers 4 and the ohmic electrodes 12 are partially exposed from the laser oscillation section 9. Besides, an ohmic electrode P3 is formed on the exposed portion (hereinafter, referred to as exposed portion) of the ohmic electrode layer 12.

When a drive current is supplied through the ohmic electrodes P1 and P3, the drive current will flow into the ohmic electrode layers 8 and 12, while a confined current will flow into the above-mentioned active layer of the laser oscillation section 5 through the ridge waveguide 6, thereby effecting a light emission. Further, a laser resonator is formed by cleaved facets (mirror facets) formed on both ends of the ridge waveguide 6, and a light guided along the ridge waveguide 6 is reflected repeatedly by the cleaved facets (mirror facets) on the two ends, thereby successively inducing carrier recombination and effecting an induced emission reciprocatingly, thus emitting the aforementioned short wavelength laser beam from the cleave facets.

Similarly, when a drive current is supplied through the ohmic electrodes P2 and P3, the drive current will flow through the ohmic electrode layer 12 and the adhesive metal layer 4, while a confined current will flow into the above-mentioned active layer of the laser oscillation section 9 through the ridge waveguide 10, thereby effecting a light emission. Further, a laser resonator is formed by cleaved facets (mirror facets) formed on both ends of the ridge waveguide 10, and a light guided along the ridge waveguide 10 is reflected repeatedly by the cleaved facets (mirror facets) on the two ends, thereby successively inducing carrier recombination and effecting an induced emission reciprocatingly, thus emitting the aforementioned long wavelength laser beam from the cleaved facets.

In addition, a high reflection coating is formed on the backside cleaved facet of the first and second light emitting elements 2, 3.

Next, a process of manufacturing the semiconductor laser device 1 having the above-described configuration will be explained with reference to FIGS. 2 and 3.

First, as shown in FIG. 2A which is a cross-sectional view, a first intermediate body 100 for forming a plurality of first light emitting elements 2 and a second intermediate body 200 for forming a plurality of second light emitting elements 3, are produced in advance in a manner shown in FIG. 2B which is also a cross-sectional view.

Namely, as shown in FIG. 2A, a plurality of semiconductor thin layers consisting of group-III nitride semiconductors or the like and having different compositions and thicknesses are formed and laminated on the semiconductor substrate SUB 1 consisting of group-III nitride semiconductor or the like, by means of MOCVD method or the like. As a result, a double hetero (DH) structure including the aforementioned active layer of multiple quantum well structure and clad layers are formed, followed by partially etching a portion over the active layer, thereby forming a plurality of ridge waveguides 6 at predetermined intervals. Furthermore, as shown in FIG. 2A, after forming an insulating layer 7 on the entire top surface except the ridge waveguide 6, the ohmic electrode layer 8 and the adhesive metal layer 4a are successively formed and laminated on the entire surface including the ridge waveguide 6 and the insulating layer 7, by means of evaporation.

By this manufacturing process, the intermediate body 100 is thus produced for forming a plurality of first light emitting elements 2.

Then, as shown in FIG. 2B, an etching stopping layer STP for stopping etching process is formed by MOCVD method or the like on the semiconductor substrate 13 consisting of GaAs or the like. Then, a plurality of semiconductor thin layers consisting of compound semiconductor containing As or P as group V element and having different compositions and thicknesses are formed on the etching stop layer STP, thereby forming a double hetero (DH) structure including the aforementioned active layer of strained multiple quantum well structure and clad layers, followed by partially etching a portion over the active layer, thus forming a plurality of stripe-shaped ridge waveguides 10 at the same intervals as the-above ridge waveguides 6.

Furthermore, as shown in FIG. 2B, after forming an insulating layer 11 on the entire upper portion except the ridge waveguide 10, an ohmic electrode layer 12 is laminated on the entire surface covering the ridge waveguide 10 and the insulating layer 11, followed by forming a adhesive metal layer 4b on the ohmic electrode layer 12.

In this way, using this manufacturing process, the intermediate body 200 capable of forming a plurality of second light emitting elements 3 is thus produced.

Next, as shown in FIG. 2C, the intermediate bodies 100,200 produced in advance are aligned with the adhesive metal layers 4a and 4b, thereby effecting combination of the intermediate bodies 100, 200 with these adhesive metal layers.

Here, an alignment operation is performed so that the ridge waveguides 6 and 10 of the intermediate bodies 100,200 are allowed to face each other with only a short distance therebetween. Then, positioning adjustment is carried out in advance so that the light emitting spots of the laser oscillation sections 5 and 9 of the respective semiconductor laser devices 1 can get close to each other after a cleavage operation or the like for dividing these materials into individual semiconductor laser devices.

Subsequently, the intermediate bodies 100,200 are pressed towards each other with a predetermined urging force and then heated entirely so as to fuse together the adhesive metal layers 4a and 4b, followed by cooling process. Consequently, as shown in FIG. 2D, the adhesive metal layers 4a and 4b are combined into an integral adhesive metal layer 4, thereby fixing the intermediate bodies 100, 200 with the adhesive metal layer 4 interposed therebetween, thus forming an integrally formed intermediate body 300.

Next, as shown in FIG. 2E, etching treatment is performed on the semiconductor substrate 13 until an etching stop layer STP is exposed, thereby removing the semiconductor substrate 13.

Subsequently, as shown in FIG. 2F, wet etching treatment is performed to remove an area extending from the etching stop layer STP to the insulating layer 11, but leaving a plurality of portions forming a plurality of laser oscillation sections 9. In this way, as shown in FIG. 2G, a plurality of laser oscillation sections 9 producing a plurality of convex portions on cross section are formed, while the ohmic electrode layer 12 is exposed in concave portions R formed among the laser oscillation sections 9. Namely, as shown in FIG. 2G, the ohmic electrode layer 12 is partially exposed as exposed portions 12R.

Next, as shown in FIG. 3A, the etching stop layer STP is removed, while ohmic electrodes P1, P2, and P3 are respectively formed by vapor deposition on the semiconductor substrate SUB 1, the exposed surface of each laser oscillation section 9, and the exposed portions 12R of the ohmic electrode layer 12.

Afterwards, as shown in FIG. 3B, the intermediate body 300 is cleaved at a predetermined interval in the vertical direction of the ridge waveguides 6 and 10, followed by forming a high reflective coating on one of every two cleaved faces.

Subsequently, as shown in FIG. 3C, dividing by scribing are performed along the exposed portions 12R of the ohmic electrode layer 12, thereby producing the respective semiconductor laser devices 1 having the structure shown in FIGS. 1A and 1B.

Thus, according to the semiconductor laser device 1 of the present embodiment shown in FIGS. 1A and 1B, since the laser oscillation sections 5 and 9 are fixed by the adhesive metal layer 4 interposed therebetween, it is possible to reduce the distance between the light emitting spot of the laser oscillation section 5 and the light emitting spot of the laser oscillation section 9.

Namely, the adhesive metal layer 4 is only required to have a thickness necessary to fix the laser oscillation sections 5 and 9. Thus, it becomes possible to greatly reduce the distance between the light emitting spots by providing the adhesive metal layer 4 having an extremely small thickness as compared with the thickness of the substrate disclosed in prior art.

Furthermore, since the insulating layers 7, 11 and the ohmic electrode layers 8, 12 are also allowed to have small thickness provided that their functions are taken into account, it is possible to further reduce the distance between the light emitting spots.

In addition, according to the present embodiment shown in FIGS. 1A and 1B, since the adhesive metal layer 4 and the ohmic electrode layer 12 are partially exposed toward the laser oscillation section 9 side, it is easy to form an electric contact with these exposed portions, thereby making it possible to realize a simplified assembling process.

Besides, since the adhesive metal layer 4 and the ohmic electrode layers 8, 12 can serve as so-called common electrode for applying a driving current to the laser oscillation sections 5 and 9, it is possible to provide an improved semiconductor laser device in which the number of electrodes for supplying driving current has been reduced.

Furthermore, the present embodiment is different from a conventional process in which the light emitting elements to be attached are fabricated as individual semiconductor chips in advance, followed by attaching these light emitting elements so as to form a hybrid structure. That is, the present embodiment is as shown in FIGS. 2 and 3 in which the intermediate bodies 100, 200 capable of forming a plurality of first and second light emitting elements 2, 3 are fixed by virtue of the adhesive metal layer 4 to form the intermediate body 300, followed by cleaving and scribing the intermediate body 300 so as to divide the intermediate body into a plurality of semiconductor laser devices 1.

For this reason, when the intermediate bodies 100, 200 are fixed by virtue of the adhesive metal layer 4 in a semiconductor manufacturing process, it is possible to perform in one step an optimum control of the distance between the light emitting spots of the semiconductor laser devices 1 to be later formed by dividing treatment, also possible to perform position alignment between the respective light emitting spots with a high precision. In this way, since it is possible to perform in one step an optimum control of the distance between the light emitting spots, it becomes possible to improve industrial productivity and to ensure a uniformity in product quality.

Furthermore, since the ridge waveguides 6, 10 of the laser oscillation sections 5, 9 are located close to the adhesive metal layer 4, and since there has been formed a structure in which a part of the adhesive metal layer 4 is exposed, it is possible to efficiently dissipate the heat generated by the laser operation of the laser oscillation sections 5, 9.

Moreover, if the semiconductor laser device 1 of the present embodiment is used as a light source for an optical pickup for performing data recording or playback on CD, DVD and other storage medium, since a distance between the light emitting spots is small, the respective light emitting spots of the first and second light emitting elements 2, 3 can be aligned at a high precision with the optical axis of the optical pickup, thereby making it possible to greatly inhibit the occurrence of an aberration or the like.

In the above-discussed manufacturing process according to the present embodiment, as shown in FIG. 2B, the etching stop layer STP is formed over an entire area between the semiconductor substrate 13 and the laser oscillation section 9 of the intermediate body 200. Then, as shown in FIGS. 2E to 2G, after removing the semiconductor substrate 13 by etching, the etching stop layer STP and the laser oscillation section 9 are also partially etched, thereby forming a plurality of laser oscillation sections 9, and partially exposing the ohmic electrode layer 12. However, the present invention is by no means to be limited by such a manufacturing process. In fact, some other manufacturing processes can also be used to form a plurality of laser oscillation sections 9 and partially expose the ohmic electrode layer 12.

For example, as a modification of the present embodiment, it is also possible to use a process shown in FIG. 4A. Namely, etching stop layers STP are partially formed on the semiconductor substrate 13 in a manner such that the respective laser oscillation sections 9 can be formed. Subsequently, a plurality of laser oscillation sections 9 having ridge waveguides 10, the ohmic electrode layer 12 and the adhesive metal layer 4b are successively laminated on the etching stop layer STP and the semiconductor substrate 13, thereby forming the intermediate body 200 which are later used to form a plurality of light emitting elements 3.

Next, in the same manner as shown in FIGS. 2C and 2D, the intermediate body 200 and the above-mentioned intermediate body 100 are combined together and heated, followed by cooling down, thereby fusing together the adhesive metal layer 4b of the intermediate body 200 and the adhesive metal layer 4a of the intermediate body 100, thus producing the intermediate body 300 in an integral form by virtue of thus solidified adhesive metal layer 4.

Next, as shown in FIG. 4B, etching process is carried out so as to remove the semiconductor substrate 13, while at the same time removing those exposed portions of the laser oscillation section 9 and the insulating layer 11 not covered with the etching stop layer STP. In this way, as shown in FIG. 4C, a plurality of laser oscillation sections 9 each having a convex cross section are formed, while the ohmic electrode layer 12 is exposed in the recess portions R between the laser oscillation sections 9.

Then, similar to those shown in FIGS. 3A to 3C, after forming the ohmic electrodes P1, P2, and P3 in the predetermined portions of the intermediate body 300, the respective semiconductor laser devices 1 are thus produced by cleaving and scribing.

In this way, even if the etching stop layer STP is formed only to cover the areas for forming the respective laser oscillation sections 9, it is still possible to form the semiconductor laser device 1 of the present embodiment.

Furthermore, if the etching stop layer STP is formed only to cover the areas for forming the respective laser oscillation sections 9, it is possible for one etching process to include an etching step of removing the semiconductor substrate 13 (as shown in FIGS. 4B and 4C), an etching step of removing those exposed portions of the laser oscillation sections 9 and the insulating layer 11 not covered with the etching stop layer STP, thereby simplifying the manufacturing process.

Although the present embodiment has been described on the base of an example in which the laser oscillation section 9 forming the second light emitting element 3 is formed by III–V compound semiconductor thin films in which V group element consists of As or P, it is also possible for the laser oscillation section to be formed by III–V compound semiconductor thin film in which group V element consists of Sb. In addition, the laser oscillation section 9 may be formed not only by the III–V compound semiconductor thin films, but it may also be formed by II–VI compound semiconductor thin films.

(First Example)

Figure 6:
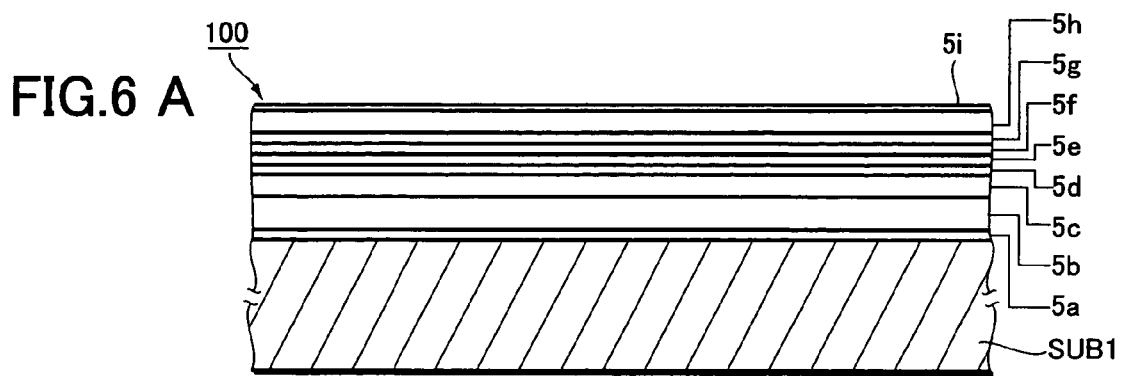
FIGS. 6A–6D are cross sectional views showing a process of manufacturing the semiconductor laser device of the first example.
Figure 6:
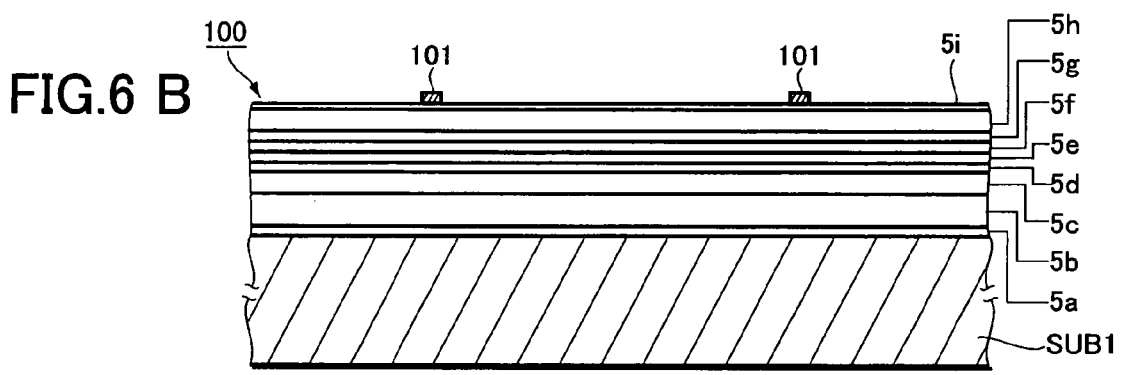
Figure 6:
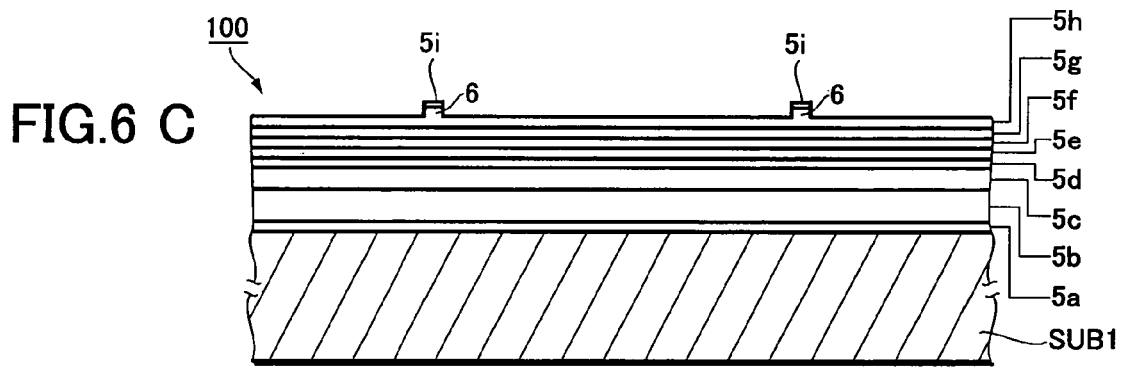
Figure 6:
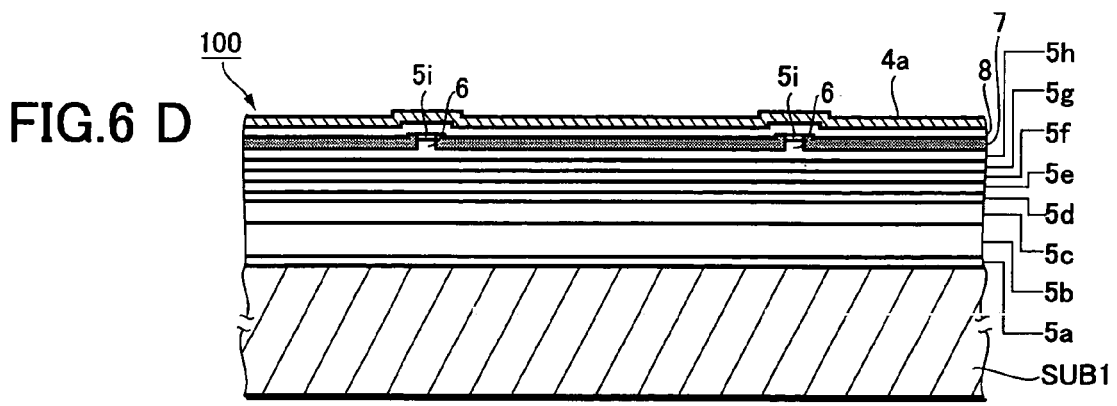
Figure 7:
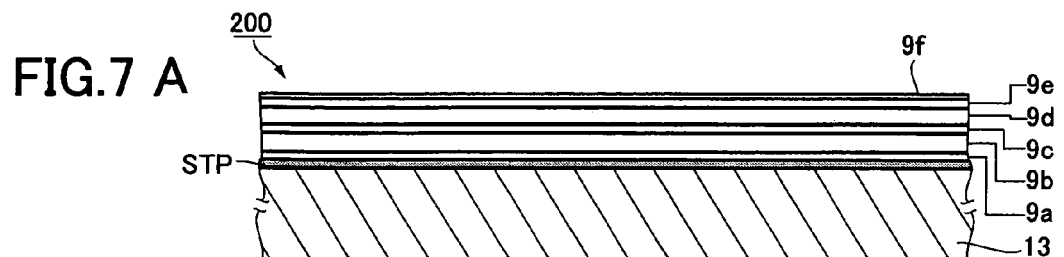
FIGS. 7A–7D are cross sectional views further showing the process of manufacturing the semiconductor laser device of the first example.
Figure 7:
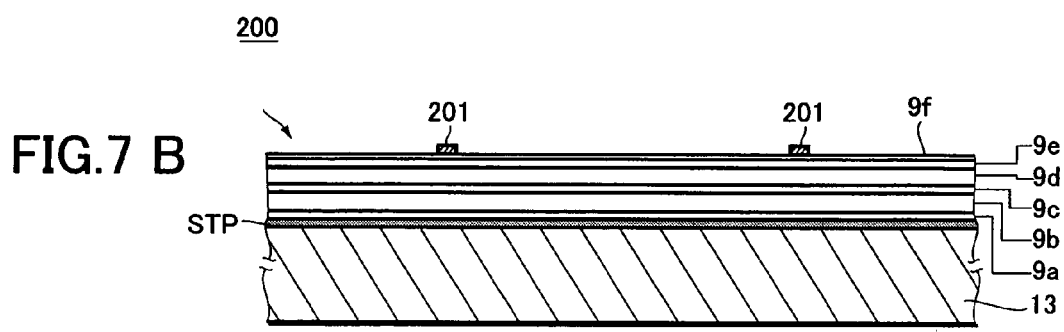

Next, a first example of the first embodiment of the present invention will be described with reference to FIGS. 5 to 7.

Figure 1:
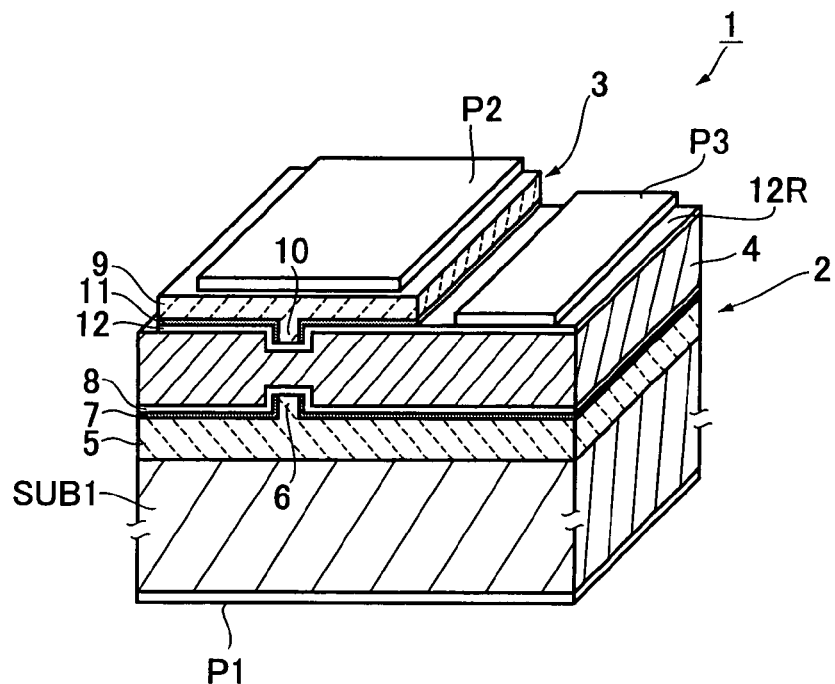
FIGS. 1A and 1B are views showing an external configuration and a cross-sectional structure of a semiconductor laser device formed according to a first embodiment of the present invention.
Figure 1:
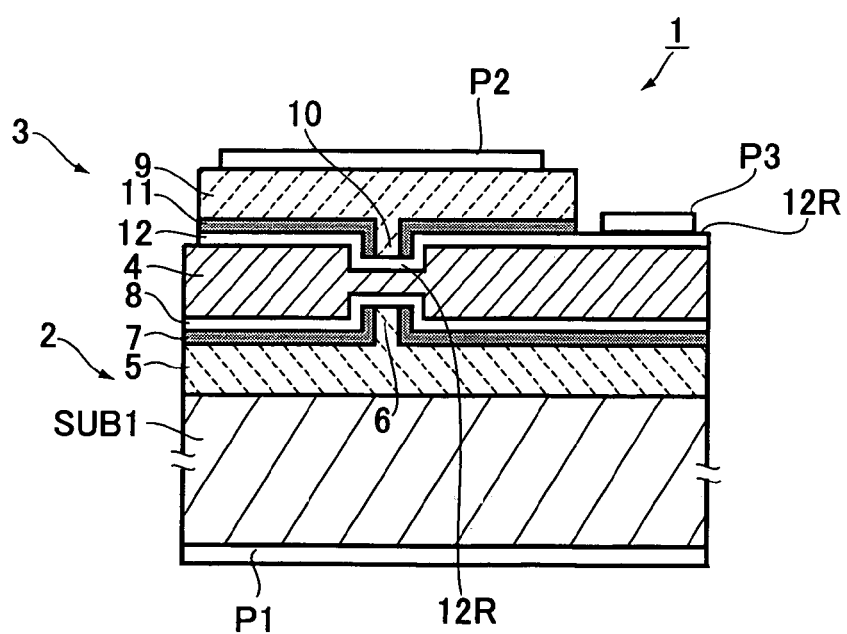
Figure 5:
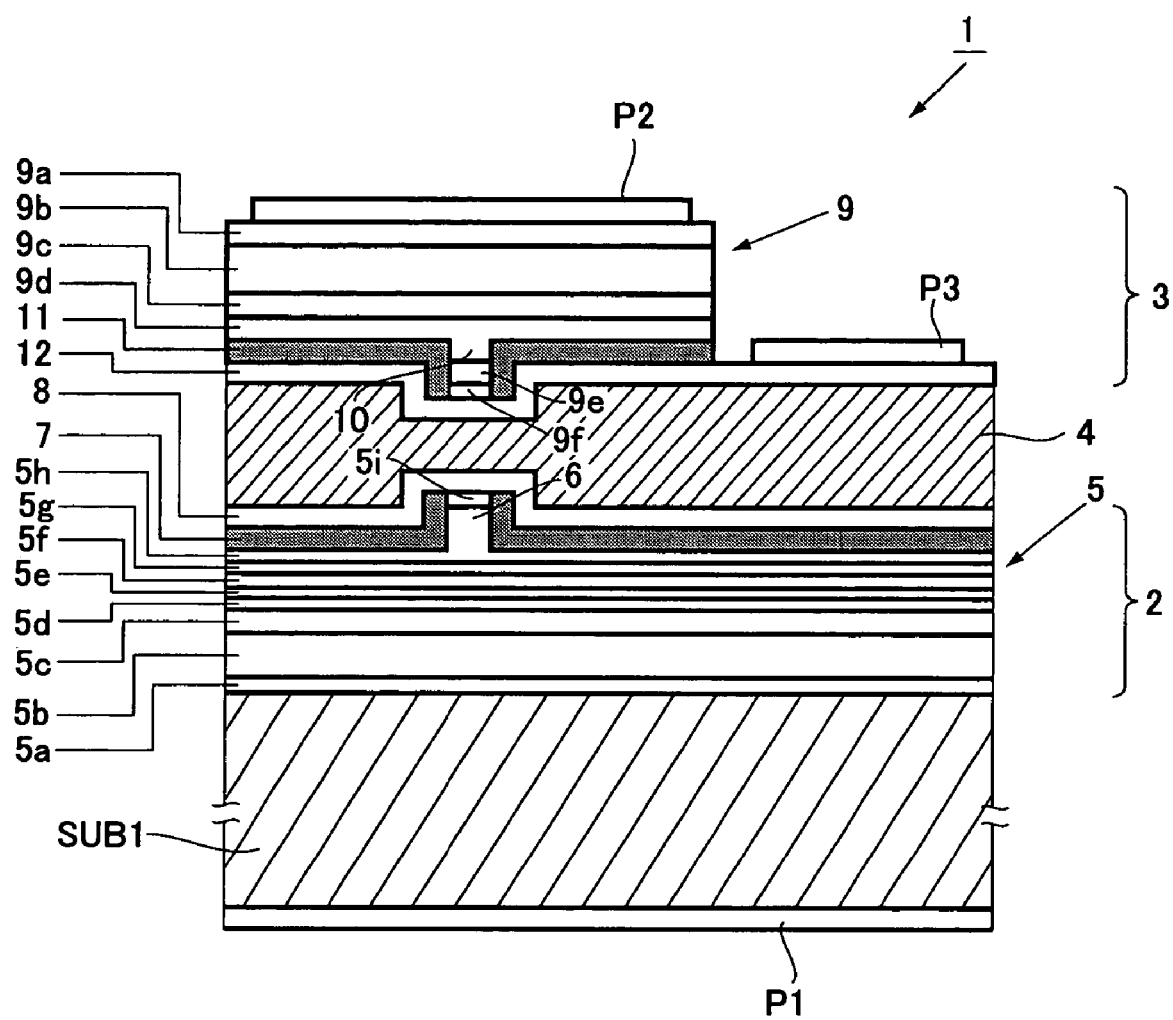
FIG. 5 is a cross sectional view showing the structure of the semiconductor laser device formed according to a first example.

FIG. 5 is a cross-sectional view corresponding to FIGS. 1A and 1B, showing the structure of a semiconductor laser device of the first example. FIGS. 6 and 7 are views showing the manufacturing process of this semiconductor laser device. However, in FIGS. 5 to 7, elements which are the same as or similar to those shown in FIGS. 1 to 3 will be represented by the same reference numerals.

As shown in FIG. 5, the semiconductor laser device 1 of this example has a hybrid structure including the first light emitting element 2 which is a GaN-based laser (blue laser) and the second light emitting element 3 which is an AlGaInP-based laser (red laser), integrated together by virtue of the adhesive metal layer having an electric conductivity.

The first light emitting element 2 includes the laser oscillation section 5 formed on the semiconductor substrate (n type GaN substrate) SUB 1 and has a ridge waveguide 6, while the second light emitting element 3 includes the laser oscillation section 9 having a ridge waveguide 10.

Further, since there is a difference between the specific areas of the laser oscillation sections 5 and 9, a part of the adhesive metal layer 4 is exposed toward the laser oscillation section 9 side, while the ohmic electrodes P1, P2, and P3 are formed respectively on the semiconductor substrate SUB 1, the laser oscillation section 9, and the exposed portion of the adhesive metal layer 4.

When a driving current is supplied through the ohmic electrodes P1 and P3, the first light emitting element 2 will emit laser lights in a range from the blue light to the ultraviolet light (for example, having a wavelength of 400 nm). On the other hand, when a driving current is supplied through the ohmic electrodes P2 and P4, the second light emitting element 3 will emit a red laser light (having a wave-length of 600 nm–700 nm).

The laser oscillation section 5 of the first light emitting element 2 has a multilayer structure formed by successively stacking, on the semiconductor substrate SUB 1 consisting of the above-mentioned n-type GaN (0001) substrate, a buffer-layer 5a, a bottom layer 5b, an n-type clad layer 5c, an n-type guide layer 5d, an active-layer 5e, an electron barrier layer 5f, a p-type guide layer 5g, a p-type clad layer 5h, and a p-type contact layer 5i. Then, an etching treatment or the like is carried out to partially remove the p-type contact layer 5i and the p-type clad layer 5h, thereby forming the ridge waveguide 6 along the <1-100> direction.

Then, the insulating layer 7 is formed all over the p-type clad layer 5h except the p-type contact layer 5i, while the ohmic electrode layer 8 is further formed all over the p-type contact layer 5i and the insulating layer 7.

Therefore, the ridge waveguide 6 is electrically connected to the adhesive metal layer 4 through the p-type contact layer 5i and the ohmic electrode layer 8.

In more detail, the buffer layer 5a consists of GaN or AlN and is formed into a thickness of about several tens of nm. The bottom layer 5b consists of n-type GaN doped with Si for n-type conductivity, and has a thickness of about 5–15 micrometers. The n-type clad layer 5c consists of n-type $Al_{0.08}Ga_{0.92}N$, and has a thickness of about 0.8 micrometers. The n-type guide layer 5d consists of n-type GaN and has a thickness of about 0.2 micrometers.

The active-layer 5e is formed into a thickness of about several tens of nm, and has the multiple quantum well structure including well layers and barrier layers consisting of $In_xGa_{1-x}N$ (provided, 0<=x) of different compositions such as $In_{0.08}Ga_{0.92}N$ and $In_{0.01}Ga_{0.99}N$, respectively.

Here, the electron barrier layers 5f consists of AlGaN and has a thickness of about 0.02 micrometers. The p-type guide layer 5g consists of p-type GaN doped with Mg for p-type conductivity, and is formed into a thickness of about 0.2 micrometers.

The p-type clad layer 5h consists of p-type $Al_{0.08}Ga_{0.92}N$ and has a thickness of about 0.4 micrometers. The p-type contack layer 5i consists of p-type GaN and has a thickness of about 0.1 micrometers.

Moreover, the ohmic electrode layer 8 is formed either by one of Pd, Pt, Au and Ni, or by an alloy containing two or more of these elements. The insulating layer 7 is formed by $SiO_2$ or the like.

Although the details of the above-described structure will be further discussed when describing a related manufacturing process, the adhesive metal layer 4 is formed by an alloy produced by alloying together the adhesive metal layer 4a of Au and the adhesive metal layer 4b of Sn.

The laser oscillation section 9 of the second light emitting element 3 has the multilayer structure formed by successively stacking a buffer-layer 9a, an n-type clad layer 9b, an active-layer 9c, a p-type clad layer 9d, a smoothing layer 9e and a p-type contact layer 9f. Then, the p-type contact layer 9f, the smoothing layer 9e and the p-type clad layer 9d are partially removed by an etching treatment, so that the above-mentioned ridge waveguide 10 can be formed along the same direction as the ridge waveguide 6.

Then, the whole surface of the laser oscillation section 9 excluding the above-mentioned p-type contact layer 9f is covered with an insulating layer 11. Further, the ohmic electrode layer 12 is formed on the p-type contact layer 9f and the entire surface of the insulating layer 11, thereby allowing the p-type contact layer 9f to be electrically connected to the ohmic electrode layer 12 and further electrically connected with the adhesive metal layer 4 through the ohmic electrode layer 12.

Specifically, the buffer-layer 9a consists of n-type GaAs doped with Si for n-type conductivity, and has a thickness of about 0.5 micrometers. The n-type clad layer 9b consists of n-type $Al_{0.35}Ga_{0.15}In_{0.5}P$, and has a thickness of about 1.2 micrometers.

The active-layer 9c is formed into a thickness of several tens of nm, and has the strained multiple quantum well structure consisting of GaInP and AlGaInP. The p-type clad layer 9d consists of $Al_{0.35}Ga_{0.15}In_{0.5}P$ doped with Zn for P-type conductivity, and has a thickness of about 1.2 micrometers. The smoothing layer 9e consists of p-type $Ga_{0.51}In_{0.49}P$, and has a thickness of about 0.05 micrometers. The p-type contact layer 9f consists of p-type GaAs, and has a thickness of about 0.2 micrometers.

The ohmic electrode layer 12 is formed either by one of Ti, Pt, Cr, Au and Au—Zn, or by an alloy containing two or more of these elements. The insulating layer 11 is formed by $SiO_2$ or the like.

Next, the manufacturing process of the semiconductor laser device 1 in this example will be described with reference to FIG. 6 and FIG. 7.

First, the intermediate body 100 for forming a plurality of first light emitting elements 2 is produced in accordance with a process shown in FIGS. 6A to 6D, while the intermediate body 200 for forming a plurality of second light emitting elements 3 is produced in accordance with a process shown in FIGS. 7A to 7D.

As shown in FIG. 6A, the GaN-based thin films for forming the laser oscillation section 5 are formed on the semiconductor substrate SUB1 by using the MOCVD method, thereby producing the intermediate body 100.

Namely, on the semiconductor substrate SUB1 consisting of n-type GaN (0001) successively formed are the buffer layer 5a consisting of GaN or AlN and having a thickness of several tens of nm, the bottom layer 5b having a thickness of 5–15 micrometers and consisting of n-type GaN doped with Si for n-type conductivity, the n-type clad layer 5c consisting of n-type $Al_{0.08}Ga_{0.92}N$ and having a thickness of about 0.8 micrometers, the n-type guide layer 5d consisting of n-type GaN and having a thickness of 0.2 micrometers, the active-layer 5e having a multiple quantum well structure including well layer and barrier layer consisting of $In_{0.08}Ga_{0.92}N$ and $In_{0.01}Ga_{0.99}N$, the electron barrier layer 5f consisting of AlGaN and having a thickness of about 0.02 micrometers, the p-type guide layer 5g having a thickness of about 0.2 micrometers and consisting of p-type GaN doped with Mg for p-type conductivity, the p-type clad layer 5h consisting of p-type $Al_{0.08}Ga_{0.92}N$ and having a thickness of about 0.4 micrometers, and the p-type contact layer 5i consisting of p-type GaN and having a thickness of about 0.1 micrometers.

Next, as shown in FIG. 6B, a plurality of masks 101 conformed to the configuration of several ridge waveguides 6 are formed along <1-100> direction on the p-type contact layer 5i of the intermediate body 100, followed by removing exposed portions not covered by the masks 101 by a reactive ion etching (RIE).

In this process, as shown in FIG. 6C, an etching treatment is performed until the etching depth that corresponds to remaining p-type clad layer thickness of 0.05 micrometers, thereby forming a plurality of ridge waveguides 6 in the direction of <1-100> at the same intervals as those of the plurality of laser oscillation sections 5 (to be later formed), followed by removing the masks 101.

Next, as shown in FIG. 6D, the insulating layer 7 of $SiO_2$ is formed by sputtering or the like on the whole top face of the intermediate body 100 except the p-type contact layer 5i remaining on the ridge waveguides 6. Then, the ohmic electrode layer (p-side electrode layer) 8 having a thickness of about 200 nm is formed by vapor deposition on the p-type contact layer 5i and the insulating layer 7, using either one of Pd, Pt, Au and Ni or an alloy containing two or more of these elements. Subsequently, the adhesive metal layer 4a consisting of Au and having a thickness of about 200 nm is formed by vapor deposition on the ohmic electrode layer 8, thereby forming a final intermediate body 100.

Next, in the manufacturing process of the intermediate body 200, as shown in FIG. 7A, the etching stop layer STP consisting of InGaP is formed by MOCVD method on the n-type GaAs (001) substrate 13. Afterwards, an AlGaInP-based thin films for forming the laser oscillation section 9 are formed on the etching stop layer STP.

Namely, successively formed on the above-mentioned etching stop layer STP are the buffer-layer 9a having a thickness of about 0.5 micrometers and consisting of n-type GaAs doped with Si for n-type conductivity, the n-type clad 9b consisting of $Al_{0.35}Ga_{0.15}In_{0.5}P$ and having a thickness of about 1.2 micrometers, the active-layer 9c having strained multiple quantum wells consisting of GaInP and AlGaInP, the p-type clad layer 9d having a thickness of about 1.2 micrometers and consisting of $Al_{0.35}Ga_{0.15}In_{0.5}P$ doped with Zn for p-type conductivity, the smoothing layer 9e consisting of $Ga_{0.51}In_{0.49}P$ and having a thickness of about 0.05 micrometers, and the p-type contact layer 9f consisting of p-type GaAs and having a thickness of about 0.2 micrometers.

Next, as shown in FIG. 7B, a plurality of masks 201 conformed to the configuration of several ridge waveguides 10 (FIG. 5) are formed on the p-type contact layer 9f of the intermediate body 200, at the same intervals as those of the ridge waveguides 6 shown in FIGS. 6C and 6D, followed by removing exposed portions not covered by the masks 201 by a reactive ion etching (RIE).

Figure 7C:
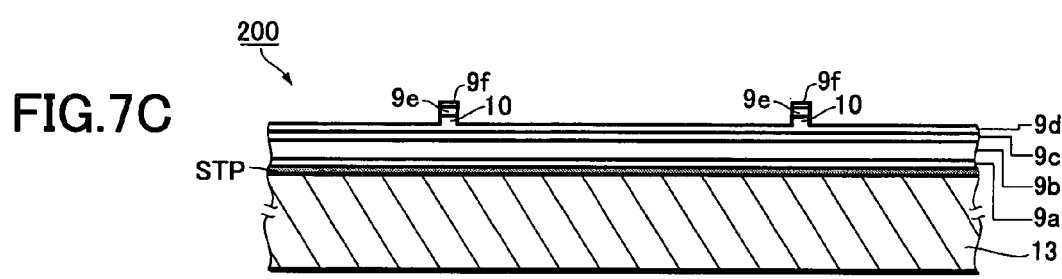
Figure 7:
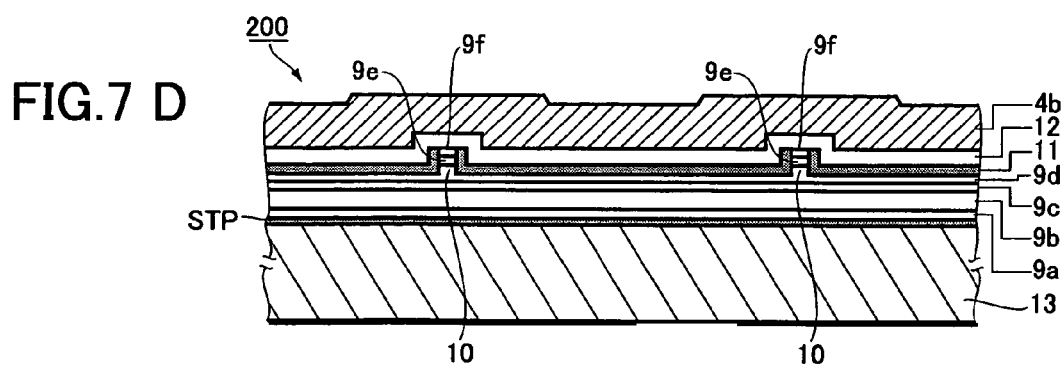

Subsequently, as shown in FIG. 7C, an etching treatment is performed until the etching depth that corresponds to remaining p-type clad layer thickness of 0.2 micrometers, thereby forming a plurality of stripe-shaped ridge waveguides 9 at the same intervals as those of the plurality of laser oscillation sections 9 (to be later formed), followed by removing the masks 201.

Next, as shown in FIG. 7D, the insulating layer 11 of $SiO_2$ is formed by sputtering or the like on the whole top face of the laser oscillation section 9 except the p-type contact layer 9f remaining on the ridge waveguides 10. Then, the ohmic electrode layer (p-side electrode layer) 12 having a thickness of about 200 nm is formed by vapor deposition on the p-type contact layer 9f and the insulating layer 11, using either one of Ti, Pt, Cr, Au and Au—Zn or an alloy containing two or more of these elements. Subsequently, the adhesive metal layer 4b consisting of Sn and having a thickness of about 1 micrometer is formed on the ohmic electrode layer 12.

In this way, after the intermediate body 100,200 have been produced, the intermediate body 100 shown in FIG. 6D has the same structure as that shown in FIG. 2A, while the intermediate body 200 shown in FIG. 7D has the same structure as that shown in FIG. 2B.

Namely, the laser oscillation section 5 shown by hatching of dotted lines in FIG. 2A has a structure containing GaN-based laser thin films 5a–5i and the ridge waveguides 6 shown in FIG. 6D, while the laser oscillation section 9 shown by hatching of dotted lines in FIG. 2B has a structure containing AlGaInP-based laser thin films 9a–9f and the ridge waveguides 10 shown in FIG. 7D.

Next, the ridge waveguides 6, 10 of the intermediate bodies 100, 200 shown in FIGS. 6D and 7D are brought to face each other so as to get the adhesive metal layers 4a and 4b in contact with each other, thereby combining the intermediate body 100 with the intermediate body 200 in the same manner as shown in FIG. 2C. Furthermore, the intermediate bodies 100,200 are combined together in a manner such that the crystal axis <1-100> of the GaN-based laser thin films 5a–5i is aligned with the crystal axis <110> of the AlGaInP-based laser thin films 9a–9f. Furthermore, in the case where the below-mentioned cleaving or the like is carried out to form a plurality of semiconductor laser devices 1, the intermediate bodies 100,200 are in advance combined together, in a manner such that the laser light emitting spot of the laser oscillation section 5, formed in the process where the below-mentioned cleaving or the like is carried out to form a plurality of semiconductor laser devices 1, can get close to the laser light emitting spot of the laser oscillation section 9 formed by the below-mentioned process of cleaving or the like.

Subsequently, in the same manner as that shown in FIG. 2D, the intermediate bodies 100,200 are pressed together under a predetermined urging force, and heated entirely at a temperature of 300 □, followed by removing the added heat. In this way, the adhesive metal layer 4a of Au and the adhesive metal layer 4b of Sn get fused with each other, forming the adhesive metal layer 4 consisting of an alloy of Au—Sn. Furthermore, heat removal treatment is performed to solidify the adhesive metal layer 4, thereby producing the intermediate body 300 in which the intermediate bodies 100,200 have been adhered to each other to form an integral body.

Next, in the same manner as that shown in FIG. 2E, an etchant in which the ratio of sulfuric-acid: hydrogen peroxide water:water is 4:1:1 is used to wet-etch the semiconductor substrate 13 in the finally formed intermediate body. In fact, such an etching process is continued until the etching stop layer STP is exposed, thereby removing the semiconductor substrate 13.

Afterwards, in the same manner as that shown in FIG. 2F, wet etching treatment is performed to remove the layers from the etching stop layer STP to the insulating layer 11, but leaving areas W for forming the laser oscillation sections 9. Consequently, as shown in FIG. 2G, a plurality of laser oscillation sections 9 each having a convex cross section are formed, thereby exposing the ohmic electrode layer 12 in the recess portions R formed between these laser oscillation sections 9 side.

Namely, by performing the above-mentioned etching treatment in which the recess portions R are formed between the laser oscillation sections 9, the specific area of each second light emitting element 3 adhered to the adhesive metal layer 4 can be made smaller than that of each first light emitting element 2 similarly adhered to the adhesive metal layer 4, thus producing an area difference between two kinds of laser oscillation sections, thereby allowing the adhesive metal layer 4 to be partially exposed when viewed from the laser oscillation section 9 side.

Next, the etching stop layer STP is removed and a predetermined cleaning treatment is performed. Then, in the same manner as that shown in FIG. 3A, the ohmic electrode P1 consisting of either one of Ti, Al and Au or an alloy containing two or more of these elements is formed on the semiconductor substrate SUB1, while the ohmic electrode P2 consisting of either one of Ni, Au and Au—Ge or an alloy containing two or more of these elements is formed on each laser oscillation section 9. Further, the ohmic electrode P3 is formed on each exposed portion 12R of the ohmic electrode layer 12.

Subsequently, in the same manner as that shown in FIG. 3B, the intermediate body 300 is cleaved at a predetermined interval, in a direction perpendicular to the ridge waveguides 6 and 10, along the surface (1-100) which is a cleavage plane of each laser oscillation section 5 consisting of GaN-based laser thin film. Afterwards, one side of each cleavage plane is coated with a highly reflective coating, thereby forming laser oscillation devices.

Then, in the same manner as that shown in FIG. 3C, scribing is performed along the exposed portions 12R of the ohmic electrode layer 12, thereby forming a plurality of semiconductor laser devices 1 shown in FIG. 5.

According to the semiconductor laser device 1 of the present embodiment, as shown in FIG. 5, since the laser oscillation sections 5 and 9 are fixed together by virtue of the adhesive metal layer 4 having a small thickness, a distance between the light emitting spot of the laser oscillation section 5 and that of the laser oscillation section 9, i.e., a distance between light emitting spots can be made relatively small. Specifically, the thickness of the adhesive metal layer 4 is allowed to be about 1 micrometer or less, while a distance between light emitting spots is also allowed to be about 1 micrometer.

Furthermore, in this example, since the adhesive metal layer 4 can serve as a so-called common electrode for applying a drive current to the laser oscillation sections 5 and 9, it is possible to reduce the number of electrodes for supplying drive current.

Moreover, according to the manufacturing method in this example, after the intermediate bodies 100,200 capable of forming a plurality of first and second light emitting elements 2, 3 are secured together by virtue of the adhesive metal layer 4, cleaving and scribing or the like are performed so as to divide the finally formed intermediate body into a plurality of semiconductor laser devices 1. In this way, it is possible to perform an optimum control of a distance between the light emitting spots of the light emitting elements 2 and 3 during only one step in which the intermediate bodies 100 and 200 are secured together, thereby effecting an alignment with a high accuracy.

Furthermore, since the ridge waveguides 6, 10 of the laser oscillation sections 5, 9 are positioned in the vicinity of the adhesive metal layer 4, and since the exposed portions of the adhesive metal layer 4 are allowed to extend outside, it is possible for the heat produced in the laser oscillation sections 5 and 9 to dissipate at a high efficiency.

Besides, in the manufacturing process of this example, since the GaAs semiconductor substrate 13 containing poisonous As (arsenic) is removed by etching treatment, it becomes possible to provide semiconductor laser devices 1 having a high safety.

When a semiconductor laser device 1 produced in this example is used as a light source for an optical pickup capable of performing data recording or data playback on a storage medium such as CD and DVD, since a distance between light emitting spots is small, it is possible for both the first and second light emitting elements 2, 3 to be highly accurately aligned with the optical axis of the optical pickup, thereby making it possible to effectively inhibit the occurrence of aberration or the like.

In the manufacturing process discussed in this first example, as shown in FIGS. 7A to 7D, since the etching stop layer STP is formed in advance on an entire area between the laser oscillation section 9 and the semiconductor substrate 13 of the intermediate body 200, and since the semiconductor substrate 13 is removed by an etching treatment before further performing a partial etching treatment on the layers from the etching stop layer STP to the insulating layer 11, it is possible to form a plurality of laser oscillation sections 9 and to partially expose the ohmic electrode layer 12.

However, the present invention should not be limited to the above-described manufacturing process. In fact, it is also possible to produce the same semiconductor laser device 1 by a manufacturing process which is the same as that shown in FIGS. 4A to 4C. Namely, the etching stop layers STP may be formed in advance between the semiconductor substrate 13 and the laser oscillation section 9 of the intermediate body 200, but only covering the areas for forming a plurality of laser oscillation sections 9. Then, the exposed portions of the laser oscillation section 9 and the insulating layer 11 not covered by the etching stop layer STP as well as the semiconductor substrate 13 may be etched during only one step, thereby forming a plurality of laser oscillation sections 9 and partially exposing the ohmic electrode layer 12.

(Second Example)

Figure 8:
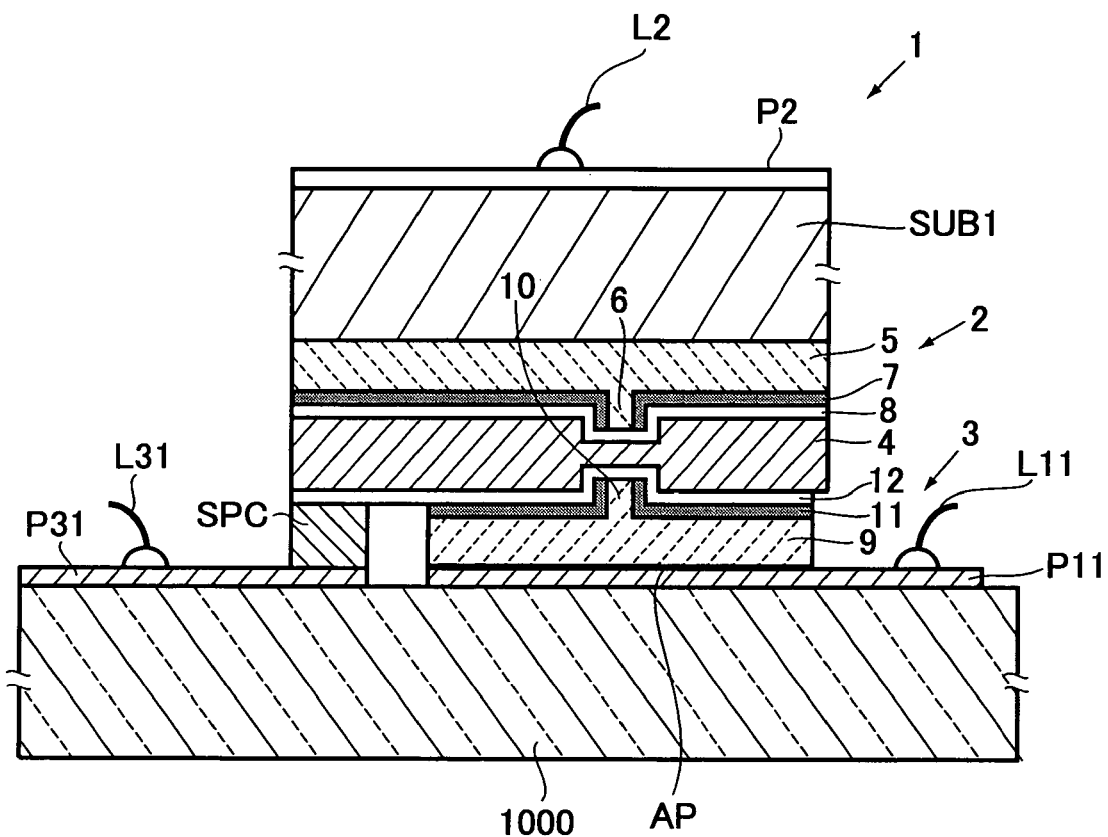
FIG. 8 is a cross sectional view showing the structure of a semiconductor laser device formed according to a second example.

Next, a second example according to the first embodiment will be described with reference to FIG. 8. Here, FIG. 8 is across section showing the structure of a semiconductor laser device produced in this example. However, elements which are the same as or equivalent to those shown in FIG. 1B are represented by the same reference numerals.

As shown in FIG. 8, this semiconductor laser device has a structure which is formed by fixing the semiconductor laser device 1 shown in FIG. 1B on a support substrate (sub-mount) 1000 formed by a specific ceramic material having a high thermal conductivity and an electric insulation Electrode layers P11 and P31 consisting of a metal such as Cu and having predetermined patterns are formed by vapor deposition on the top surface of the support substrate 1000. The laser oscillation section 9 of the second light emitting element 3 is secured on the electrode layer P11 by virtue of an extremely thin adhesive metal layer AP, while an ohmic electrode layer 12 is secured on the electrode layer 31 through a adhesive metal layer SPC serving as a conductive spacer. Further, an ohmic electrode P2 is formed on an exposed surface of the semiconductor substrate SUB1. Moreover, lead wires L11, L2, and L31 for supplying drive current are connected to the electrode layer P11 and the ohmic electrode P2 as well as the electrode layer P31.

When a drive current is supplied hereto through the lead wires L11 and L31, the drive current will flow through the electrode layers P11, P31 and the adhesive metal layers SPC, AP as well as the ohmic electrode layer 12 and the adhesive metal layer 4. Meanwhile, an electric current narrowed by the ridge waveguide 10 flows into the active layer of the laser oscillation section 9, thereby generating a light and thus emitting a red laser light (for example, having a wavelength of 600 nm–700 nm) from the second light emitting element 3.

When a drive current is supplied hereto through the lead wires L31 and L2, the drive current will flow through the ohmic electrode P2, the electrode layer 31, the adhesive metal layer SPC, as well as the ohmic electrode layer 12 and the adhesive metal layer 4. Meanwhile, an electric current narrowed by the ridge waveguide 6 flows into the active layer of the laser oscillation section 15, thereby generating a light and thus allowing the first light emitting element 2 to emit a blue laser light having a relatively short wavelength (for example, 400 nm) and in an ultraviolet region.

With the use of the semiconductor laser device produced in this example, since the first and second light emitting elements 2 and 3 are fixed on the support substrate 1000, a heat generated during the light emission of the laser oscillation sections 5 and 9 can dissipate out at a good efficiency.

In particular, since the laser oscillation section 5 is positioned separately from the support substrate 1000, it is necessary for the heat produced in the laser oscillation section 5 to dissipate at a good efficiency. On the other hand, since there have been formed a first heat dissipation path and a second heat dissipation path which will be described in the following, it is still possible for the heat produced in the laser oscillation section 5 to dissipate out at a good efficiency. Namely, the first heat dissipation path is formed to perform a heat dissipation towards the support substrate 1000 through the ohmic electrode layers 8 and 12, the adhesive metal layer 4, as well as the adhesive metal layer SPC serving as a conductive spacer, while the second heat dissipation path is formed to perform a heat dissipation towards the support substrate 1000 through the ohmic electrode layers 8, 12 and the adhesive metal layer 4 as well as the laser oscillation section 5.

That is, since a laser oscillation section 14 is entirely in contact with the adhesive metal layer 4 having a good thermal conductivity, and since an exposed portion of the ohmic electrode layer 12 is connected to the electrode layer P31 on the support substrate 1000 through the adhesive metal layer SPC, it is possible for the heat produced in the laser oscillation section 5 to dissipate out at a good efficiency by way of the above first heat dissipation path. Further, since the laser oscillation section 9 existing between the adhesive metal layer 4 and the support substrate 1000 is extremely thin, and since a substrate employed in prior art is not provided in the laser oscillation section 9, it is possible for the heat produced in the laser oscillation section 5 to dissipate towards the support substrate 1000 through the adhesive metal layer 4 and the laser oscillation section 9 (i.e., through the above second heat dissipation path).

Thus, the semiconductor laser device produced in this example should not be referred to as having only attached on the support substrate 1000 the semiconductor laser device 1 shown in FIG. 5, but should be deemed as having the configuration capable of realizing an excellent heat dissipation effect.

Moreover, although the second light emitting element 3 is allowed to have several different thicknesses, since it is as thin as several micrometers, the ohmic electrode layer 12 and the electrode layer P31 can be fixed together both electrically and mechanically by at first fusing and then solidifying the adhesive metal layer SPC between the ohmic electrode layer 12 and the electrode layer P31, thereby making it possible to simplify a related manufacturing process.

Moreover, in a related manufacturing process, since etching removal of the GaAs semiconductor substrate 13 containing poisonous As (arsenic) is carried out, it is possible to provide a semiconductor laser device 1 having a highly reliable safety.

In addition, as in the above-described first example, since the laser oscillation section 5 of the first light emitting element 2 and the laser oscillation section 9 of the second light emitting element 3 are secured together by virtue of the adhesive metal layer 4 having a small thickness, it is possible to reduce a distance between the light emitting spots of the laser oscillation sections 5 and 9. In this way, it is possible to provide an improved semiconductor laser device suitable for use in an optical pickup capable of performing information recording or information playback on a CD and a DVD or other storage medium.

[Second Embodiment]

The second embodiment of the present invention will be described in the following with reference to FIGS. 9 and 10.

Figure 9:
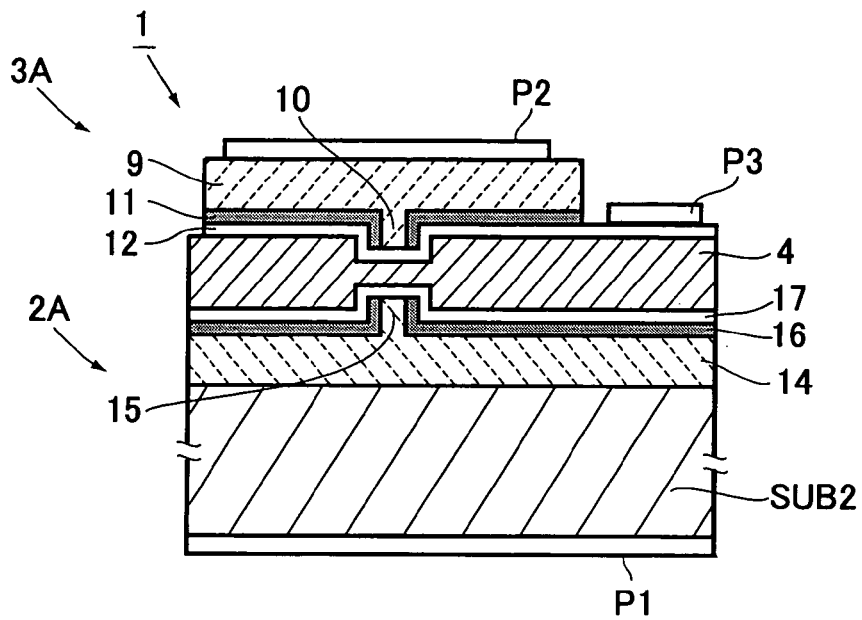
FIGS. 9A and 9B are cross sectional views showing the structure of a semiconductor laser device formed according to a second embodiment.
Figure 9:
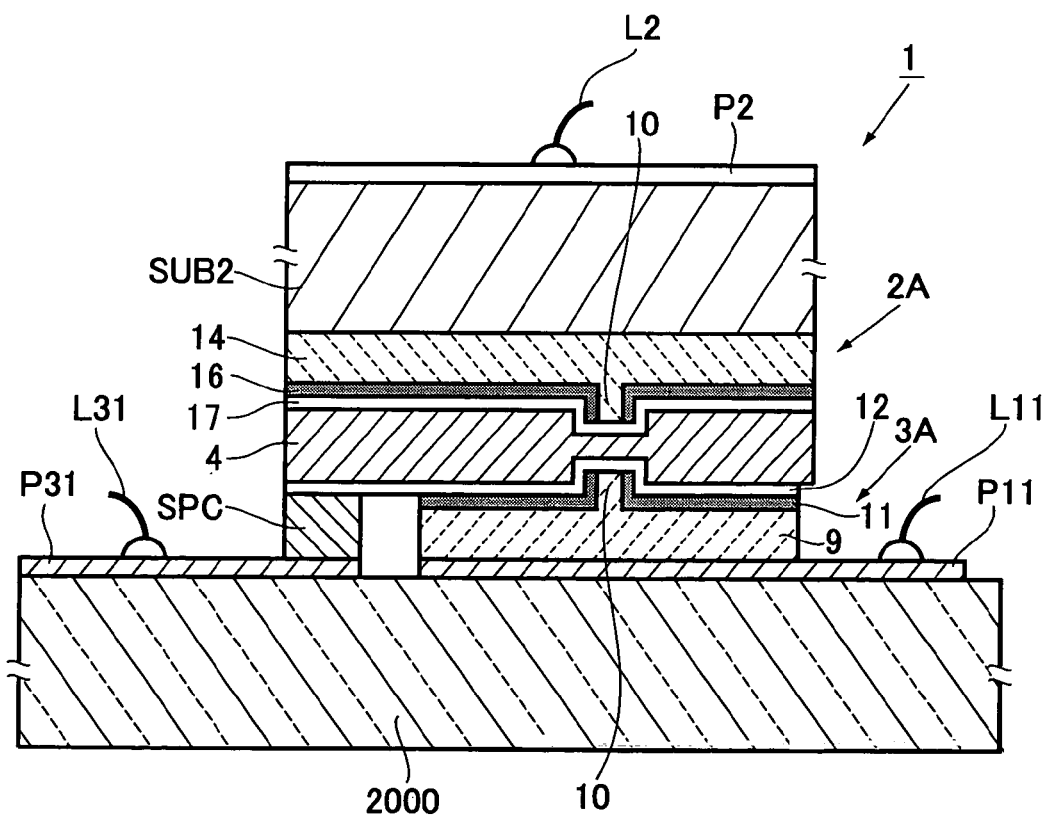
Figure 10:
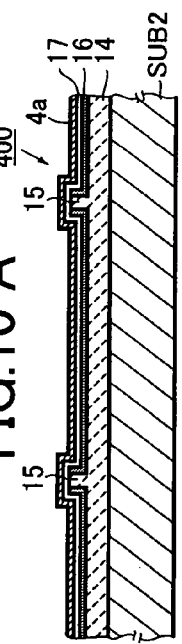
FIGS. 10A–10G are cross sectional views showing a process of manufacturing the semiconductor laser device of the second embodiment.
Figure 10:
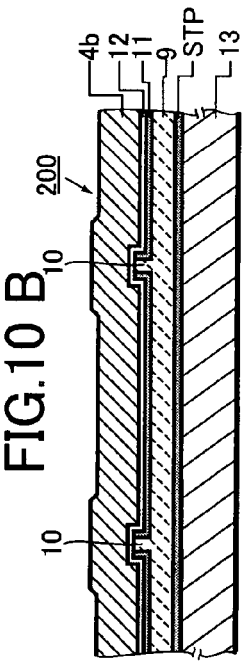
Figure 10:
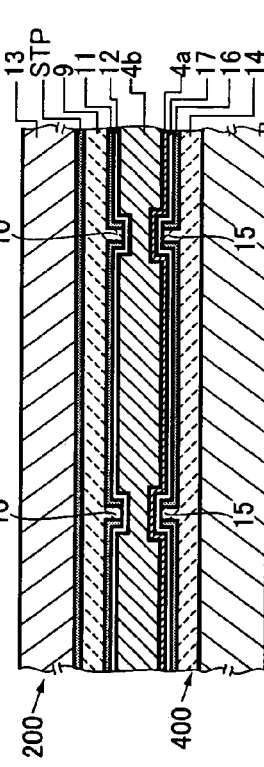
Figure 10:
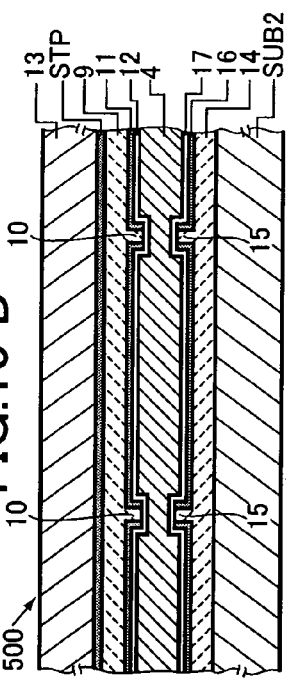
Figure 10:
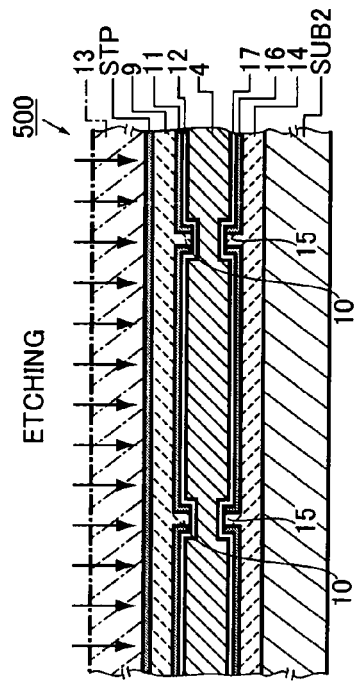
Figure 10:
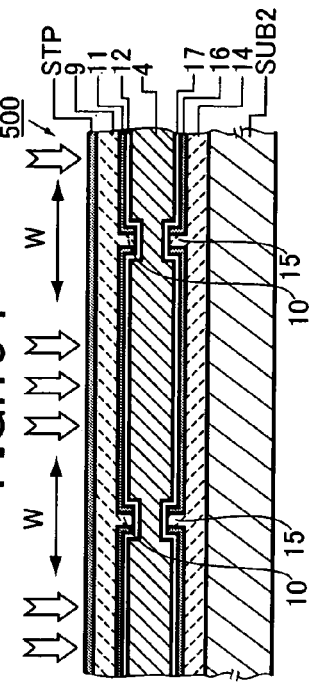
Figure 10:
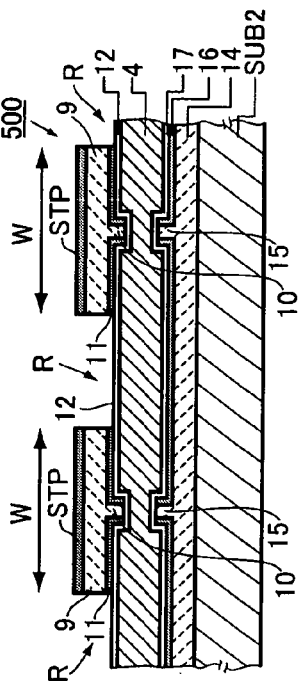

In detail, FIG. 9A is a view showing the cross-sectional configuration of a semiconductor laser device formed according to the present embodiment. FIG. 9B is a view showing the cross-sectional configuration of a semiconductor laser device formed according to a modification of the present embodiment. FIGS. 10A to 10G are views showing a manufacturing process of the semiconductor laser device shown in FIG. 9A. However, in FIG. 9 and FIG. 10, elements which are the same as or similar to those shown in FIG. 1, FIG. 2 and FIG. 8 are represented by the same reference numerals.

The semiconductor laser device 1 shown in FIG. 9A has a hybrid structure including a first light emitting element 2A capable of emitting a laser light having a wavelength of 700–800 nm, and a second light emitting element 3A capable of emitting a laser light having a wavelength of 600–700 nm, the first and second light emitting elements being secured together by virtue of the adhesive metal layer 4 having an electric conductivity.

Specifically, the first light emitting element 2A is formed on the semiconductor substrate SUB2 consisting of an III–V compound semiconductor (for example, GaAs), and includes the laser oscillation section 14 having a stripe-shaped ridge waveguide 15, an insulating layer 16 covering the top surface of the laser oscillation section 14 except the ridge waveguide 15, and an ohmic electrode layer 17 electrically connected to the stripe-shaped ridge waveguide 15 and laminated on the insulating layer 16. Further, the ohmic electrode layer 17 and the adhesive metal layer 4 are combined with each other both electrically and mechanically, while the ohmic electrode P1 is formed on the lower end of the semiconductor substrate SUB2.

Here, since the semiconductor thin films consisting of III–V compound semiconductor containing As as group V element are formed on the semiconductor substrate SUB2 consisting of the above-mentioned GaAa or the like, the laser oscillation section 14 is allowed to have an arrangement including i) double hetero (DH) structure having an active layer of strained quantum well structure and two clad layers laminated together with the active layer interposed therebetween, ii) the above-mentioned ridge waveguide 15 formed on the adhesive metal layer 4.

The second light emitting element 3A has the same configuration as the light emitting element 3 shown in FIGS. 1A and 1B, and has adhered to the adhesive metal layer 4 through the ohmic electrode layer 12. Namely, the light emitting element 3A has a multilayer structure of semiconductor thin films consisting of III–V compound semiconductor containing P or As as group V element, and has a laser oscillation section 9 including a stripe-shaped ridge waveguide 10, an insulating layer 11 insulating the whole surface of one side (facing the adhesive metal layer 4) of the laser oscillation section 9 except the ridge waveguide 10, and an ohmic electrode layer 12 electrically connected to the stripe-shaped ridge waveguide 10 and laminated on the insulating layer 11.

Here, the laser oscillation section 9 has a semiconductor multilayer film structure including a double hetero (DH) structure having an active layer of strained quantum well structure consisting of III–V compound semiconductor containing P as group V element and two clad layers laminated together with the active layer interposed therebetween, also has the above-mentioned ridge waveguide 10 formed in the adhesive metal layer 4.

In practice, the ohmic electrode layer 12 and the adhesive metal layer 4 are combined with each other both electrically and mechanically, while the ohmic electrode P2 is formed on the top surface of the laser oscillation section 9.

Here, on the light emitting element 3A whose specific area is smaller than that of the light emitting element 2A, there have been partially exposed the adhesive metal layer 4 and the ohmic electrode layer 12. The ohmic electrode P3 is formed on the partially exposed portion of the ohmic electrode layer 12.

In more detail, the laser oscillation section 9 of the second light emitting element 3A adhered to the adhesive metal layer 4 has a smaller specific area than the laser oscillation section 14 of the first light emitting element 2A adhered to the adhesive metal layer 4. Because of such a difference between the specific areas of the two laser oscillation sections, the adhesive metal layer 4 and the ohmic electrode layer 12 can be partially exposed from the laser oscillation section 9. Actually, such an exposed portion has become an electric current supply section for supplying a driving current.

In this way, when a driving current is supplied hereto through the ohmic electrodes P1 and P3, the current narrowed by the ridge waveguide 15 will flow into the above-mentioned active layer in the laser oscillation section 14, thereby generating a light which is wave-guided by the stripe shape of the ridge waveguide 15. This light is then reflected by the-cleaved facets (mirror facets) formed at both ends in the longitudinal direction of the ridge waveguide 15, thereby causing the light to reciprocate repeatedly and thus inducing carrier recombination one after another and effecting an induced emission. As a result, laser lights having a wavelength of 780 nm are emitted from the cleaved facets.

On the other hand, when a driving current is supplied hereto through the ohmic electrodes P2 and P3, the current narrowed by the ridge waveguide 10 will flow into the above-mentioned active layer in the laser oscillation section 9, thereby generating a light which is wave-guided by the stripe shape of the ridge waveguide 10. This light is then reflected by the cleaved facets (mirror facets) formed at both ends in the longitudinal direction of the ridge waveguide 10, thereby causing the light to reciprocate repeatedly and thus inducing carrier recombination one after another and effecting an induced emission. As a result, laser lights having a wavelength of 650 nm are emitted from the cleaved facets.

In addition, one surface of the cleavage plane is coated with a highly reflective coating.

Next, a manufacturing process of the semiconductor laser device 1 having the above-described structure will be described with reference to FIG. 10.

As shown in FIG. 10A which is a cross sectional view, what are at first produced includes an intermediate body 400 for forming a plurality of first light emitting elements 2A, and an intermediate body 200 for forming a plurality of second light emitting elements 3A.

Namely, MOCVD method is used to laminate, on the semiconductor substrate SUB2 consisting for example of GaAs, semiconductor thin films (having different compositions and different thicknesses) consisting of III–V compound semiconductor containing As as group V element, thereby forming the laser oscillation section 14 including the ridge waveguide 15 and a double hetero (DH) structure having an active layer of a strained quantum well structure and two clad layers laminated together with the above active layer interposed therebetween. Further, an insulating layer 16, an ohmic electrode layer 17 and a adhesive metal layer 4a are successively laminated on the laser oscillation section 14, thereby producing the intermediate body 400.

In more detail, while the above-mentioned laser oscillation section 14 is being formed on GaAs (001) semiconductor substrate SUB2, the ridge waveguide 15 is formed in the <110> direction. Then, vapor deposition process is carried out to form the ohmic electrode layer 17 consisting of Ti, Pt, Cr, Au or Au—Zn, or consisting of an alloy containing two or more of these elements. The vapor deposition process also produces a adhesive metal layer 4a consisting of Au or the like.

On the other hand, the intermediate body 200 shown in FIG. 10B may be produced in the same manner as in the above-described first embodiment shown in FIG. 2B. Specifically, the intermediate body 200 having the etching stop layer STP can be produced in the same process as employed in the example shown in FIGS. 6A–6D.

Next, as shown in FIG. 10C, the intermediate bodies 200,400 are combined together by combining together the adhesive metal layers 4b and 4a produced in advance.

Here, in an actual process, the ridge waveguides 10, 15 of the intermediate bodies 200, 400 are at first disposed to face each other at a short distance. Then, when the below-mentioned cleaving or the like is performed to divide the intermediate body into a plurality of semiconductor laser devices 1, an operation of positioning adjustment is beforehand carried out in a manner such that it is possible to reduce an interval between light emitting spots of the laser oscillation sections 9 and 14 of each semiconductor laser device 1.

More specifically, the cleavage plane (110) of the laser oscillation section 16 consisting of III–V compound semiconductor containing As as group V element of the intermediate body 400, is at first aligned with the cleavage plane (110) of the laser oscillation section 9 consisting of III–V compound semiconductor containing P or As as group V element of the intermediate body 200. Then, the intermediate bodies 200, 400 are combined together with the ridge waveguides 10, 15 facing each other at a short distance.

Then, the intermediate bodies 200, 400 are heated (at a temperature of about 300□) while being pressed under a predetermined urging force, thereby fusing together the adhesive metal layers 4a and 4b. Subsequently, the added heat is removed. In this way, as shown in FIG. 10D, the adhesive metal layers 4a and 4b are unified together to form the adhesive metal layer 4. Therefore, an integrally formed intermediate body 500 can be produced by fixing together the intermediate bodies 200 and 400 by virtue of the adhesive metal layer 4 interposed therebetween.

Next, in the process shown in FIG. 10E, the semiconductor substrate 13 is removed by an etching treatment.

Particularly, in order to prevent the semiconductor substrate SUB2 from being etched, the semiconductor substrate SUB2 is covered with a resist, a wax or the like, while an etchant in which the ratio of sulfuric-acid: hydrogen peroxide water:water is 4:1:1 is used to wet-etch the semiconductor substrate 13 consisting of GaAs (with the etching action starting from the back side thereof), thereby removing the semiconductor substrate 13.

Next, in the process shown in FIG. 10F, wet-etching treatment is carried out to remove part of the intermediate body extending from the etching stop layer STP to the insulating layer 11, thus leaving a plurality of areas W capable of forming a plurality of laser oscillation sections 9. In this way, as shown in FIG. 10G, a plurality of laser oscillation sections each having a convex cross section are formed, while a plurality of the ohmic electrode layers 12 are exposed to the recess portions R formed between the laser oscillation sections 9.

Subsequently, the etching stop layer STP is removed so that the plurality of the laser oscillation sections 9 are exposed. Then, in the same manner as that shown in FIGS. 3A to 3C, the ohmic electrodes P1,P2,P3 are formed, while cleaving and scribing are performed, thereby producing a plurality of semiconductor laser devices 1 each having a structure shown in FIG. 9A.

More specifically, the ohmic electrode P2 is formed on the exposed end of each laser oscillation section 9 occurred by removing the semiconductor substrate 13 and the etching stop layer STP, while the ohmic electrode P1 is formed on the lower end of the semiconductor substrate SUB2, all by vapor depositing either one of Ni, Au and Au—Ge, or an alloy containing two or more of these elements. Further, cleaving is carried out along the cleavage plane (110) of the semiconductor substrate SUB2 consisting of GaAs, while the cleaved facets are coated with a predetermined dielectric thin film or the like, thereby producing a plurality of laser oscillators.

Thus, with the use of the semiconductor laser device 1 formed according to the present embodiment (as shown in FIG. 9A), since the laser oscillation sections 9 and 14 may be secured together by interposing therebetween the adhesive metal layer 4 having an extremely small thickness, it is possible to greatly reduce an interval between light emitting spots. In particular, the thickness of the adhesive metal layer 4 can be set to about 1 micrometer or less, thus making it possible to ensure that a distance between light emitting spots can be about 1 micrometer.

Moreover, since the adhesive metal layer 4 and the ohmic electrode layers 8, 12 can serve as so-called common electrodes for applying driving current to the laser oscillation sections 9 and 14, it is possible to reduce the number of electrodes for supplying driving current.

Furthermore, according to the present embodiment, the unified intermediate body 500 can be produced by securing together the intermediate bodies 200, 400 using the adhesive metal layer 4. Subsequently, the intermediate body 500 is scribed and then cleaved into a plurality of semiconductor laser devices 1. In this way, during the semiconductor manufacturing process, when the intermediate bodies 200, 400 are secured together by virtue of the adhesive metal layer 4, it is possible to perform in only one step an optimum control of the light emitting spot distance of each of the semiconductor laser devices 1 formed by dividing the unified intermediate body, as well as to perform an alignment between light emitting spots with a high precision. Further, since it is possible to perform in only one step an optimum control of the light emitting spot distance of each of the semiconductor laser devices 1, it is allowed to ensure an improved productivity and a uniform product quality.

Furthermore, since the ridge waveguides 10 and 15 of the laser oscillation sections 9 and 14 are provided in the vicinity of the adhesive metal layer 4, and since the adhesive metal layer 4 is partially exposed, the heat generated by the laser oscillation sections 5 and 9 during laser light emission can dissipate out with an increased efficiency.

Moreover, when the semiconductor laser device 1 formed according to the present embodiment is mounted on an optical pickup for performing information recording or information playback on CD and DVD or other storage medium, since the light emitting spot distance is small, the light emitting spots of the first and second light emitting elements 2A and 3A can be aligned with the optical axis of the optical system of the optical pickup at a high degree of accuracy, thereby greatly inhibiting the occurrence of an aberration or the like.

Besides, in the manufacturing process according to the second embodiment, as described with reference to FIG. 10D, the etching stop layer STP is formed in an entire area between the semiconductor substrate 13 and the laser oscillation section 9, thereby forming the intermediate body 200. However, as a modification of the present embodiment, it is also possible that the etching stop layer STP is formed between the semiconductor substrate 13 and the laser oscillation section 9 only in areas that can form the plurality of laser oscillation sections 9, thereby similarly producing the intermediate body 200. Subsequently, using the same process as shown in FIGS. 4A to 4C, a plurality of laser oscillation sections 9 each having a convex cross section are formed, while the ohmic electrode layer 12 is partially exposed.

Next, the semiconductor laser device shown in FIG. 9B will be described in the following. In detail, the semiconductor laser device is formed by securing the semiconductor laser device 1 shown in FIG. 9A on a support substrate (sub-mount) made of ceramic having a high thermal conductivity and an electric insulation.

Specifically, the electrode layers P11 and P31 consisting of a metal such as Cu is formed on the top surface of the support substrate 2000.

In more detail, the laser oscillation section 9 of the second light emitting element 3A is electrically and mechanically secured to the electrode layer P11, while the exposed portions of the ohmic electrode layer 12 are electrically and mechanically secured on the electrode layer P31 through the adhesive metal layer SPC serving as a conductive spacer. Further, the ohmic electrode P2 is formed on the exposed end of the semiconductor substrate SUB2. Moreover, the lead wire L11, L2 and L31 for supplying drive current are connected to the electrode layer P11, the ohmic electrode P2 and the electrode layer P31.

When the drive current is supplied hereto through the lead wires L2 and L31, a laser light having a wave-length of 780 nm will be emitted from the laser oscillation section 14 of the first light emitting element 2A. On the other hand, when the drive current is supplied hereto through the lead wires L11 and L31, a laser light having a wave-length of 650 nm will be emitted from the laser oscillation section 9 of the second light emitting element 3A.

With the use of the semiconductor laser device shown in FIG. 9B, since the first and second light emitting elements 2A and 3A are secured on the support substrate 2000, it is possible to effectively dissipate out the heat generated during the light emission of the laser oscillation sections 9 and 14.

Especially, since the laser oscillation section 14 is positioned separately from the support substrate 2000, it is necessary to highly effectively dissipate out the heat produced in the oscillation section 14. On the other hand, it is also possible to highly effectively dissipate out the heat produced in the oscillation section 14 through a first heat dissipation path and a second heat dissipation path. Here, the first heat dissipation path is capable of dissipating heat towards the support substrate 2000 through the ohmic electrode layers 12 and 17, the adhesive metal layer 4, and the adhesive metal layer SPC serving as a conductive spacer, while the second heat dissipation path is capable of dissipating heat towards the support substrate 2000 through the ohmic electrode layers 12 and 17, the adhesive metal layer 4 and the laser oscillation section 5.

That is, since the laser oscillation section 14 is almost entirely in contact with the adhesive metal layer 4 having a good thermal conductivity and since the exposed portions of the ohmic electrode layer 12 are connected to the adhesive metal layer P31 on the support substrate 2000, the heat produced in the laser oscillation section 14 is allowed to effectively dissipate out towards the support substrate 2000 by way of the above-mentioned first heat dissipation path. Furthermore, since the laser oscillation section 9 existing between the adhesive metal layer 4 and the support substrate 2000 is extremely thin, and since a substrate discussed in the above prior art is not provided in the laser oscillation section 9, it is possible for the heat produced in the laser oscillation section 14 to effectively dissipate towards the support substrate 2000 through the adhesive metal layer 4 and the laser oscillation section 9 (i.e., the above-mentioned second heat dissipation path).

Thus, the semiconductor laser device of this embodiment is not a structure formed only by attaching the semiconductor laser device 1 shown in FIG. 9A to the support substrate 2000, but a structure capable of realizing an excellent heat dissipation effect.

Furthermore, although the second light emitting element 3A has a thickness to some extent, since its thickness is as thin as several micrometers, it is possible to secure together the ohmic electrode layer 12 and the electrode layer P31 both electrically and mechanically, only by fusing and then solidifying the adhesive metal layer SPC between the ohmic electrode layer 12 and the electrode layer P31, thus simplifying the manufacturing process.

[Third Embodiment]

Next, the third embodiment of the present invention will be described with reference to FIG. 11 and FIG. 12.

Figure 11:
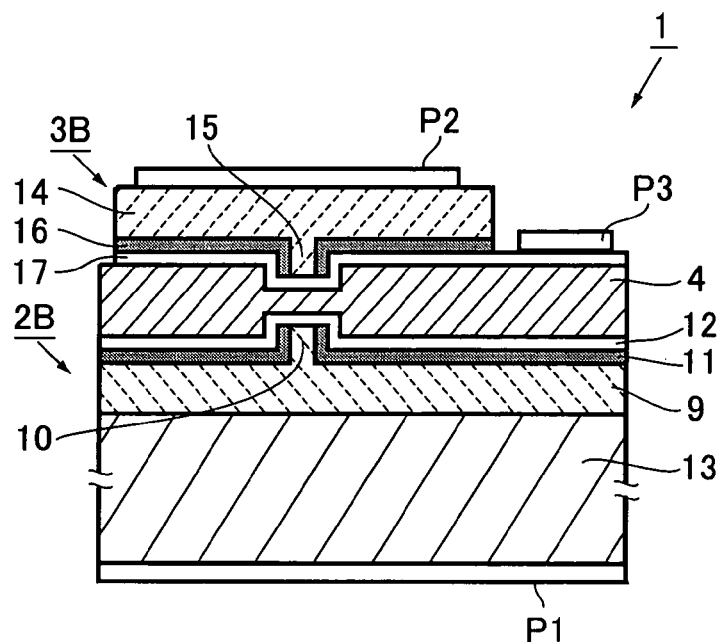
FIGS. 11A and 11B are cross sectional views showing the structure of a semiconductor laser device formed according to a third embodiment.
Figure 11:
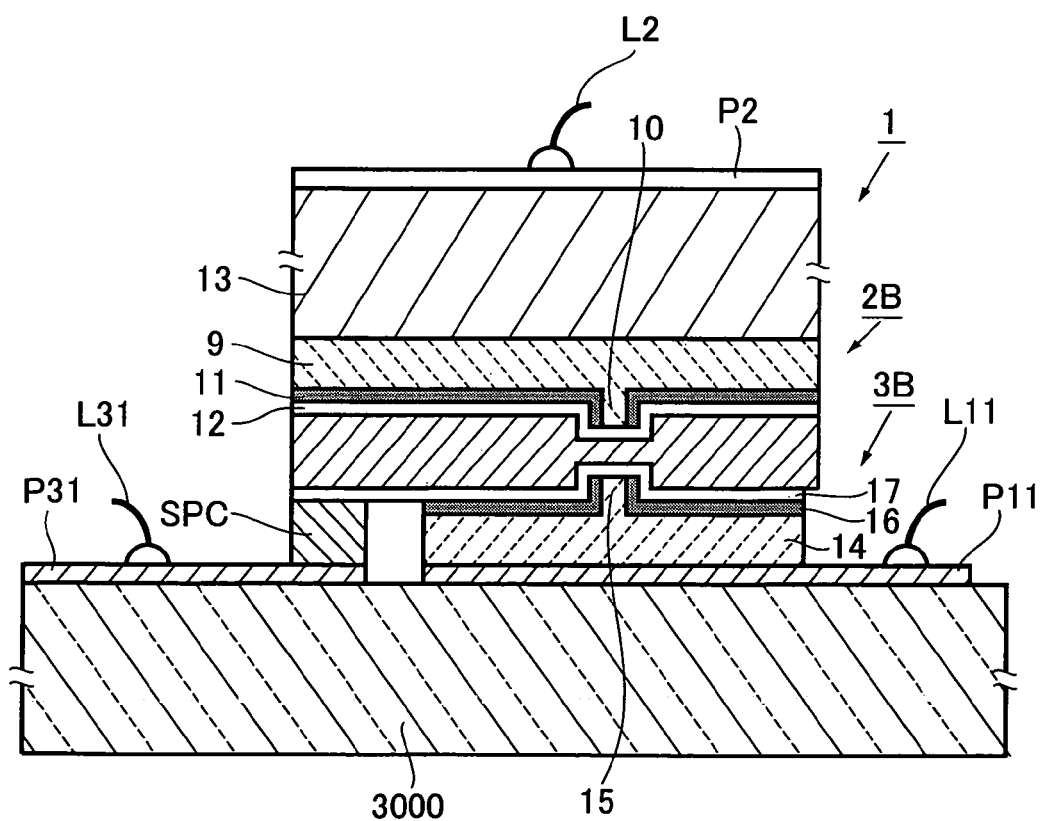

In detail, FIG. 11A is a cross sectional view showing a sectional configuration of a semiconductor laser device formed according to the third embodiment of the present invention. FIG. 11B is a cross sectional view showing a sectional configuration of a modified semiconductor laser device formed according to the third embodiment. FIGS. 12A–12G are cross sectional views showing a process of manufacturing the semiconductor laser devices shown in FIGS. 11A and 11B. However, in FIG. 11 and FIG. 12, elements which are identical as or corresponding to those in FIG. 9 and FIG. 10 are represented by the same reference numerals.

The semiconductor laser device 1 shown in FIG. 1A has a hybrid structure formed by integrally securing together a first light emitting element 2B capable of emitting a laser light having a wavelength of 600–700 nm and a second light emitting element 3B capable of emitting a laser light having a wavelength of 700–800 nm, by virtue of the adhesive metal layer 4 having a predetermined conductivity.

The first light emitting element 2B is constituted by forming, on a semiconductor substrate 13 consisting of III–V compound semiconductor (for example, GaAs), a laser oscillation section 9 having a stripe-shaped ridge waveguide 10, an insulating layer 11 insulating an entire surface (on the ridge waveguide side) of the laser oscillation section 9 except the ridge waveguide 10, and an ohmic electrode layer 12 laminated on the insulating layer 11 and in an electric contact with the ridge waveguide 10.

Here, the laser oscillation section 9 has a semiconductor multiplayer structure including a double hetero (DH) structure having an active layer of a strained quantum well structure consisting of the III–V compound semiconductor and two clad layers laminated together with the active layer interposed therebetween, also has the above-mentioned ridge waveguide 10 formed in contact with the adhesive metal layer 4.

Further, the ohmic electrode layer 12 and the adhesive metal layer 4 are combined together both electrically and mechanically, while an ohmic electrode P1 is formed on the lower end of the semiconductor substrate 13.

The second light emitting element 3B includes a laser oscillation section 14 having a stripe-shaped ridge waveguide 15, an insulating layer 16 insulating the entire upper surface of the laser oscillation section 14 except the ridge waveguide 15, and an ohmic electrode layer 17 laminated on the insulating layer 16 and in an electric contact with the ridge waveguide 15. Further, the ohmic electrode layer 17 and the adhesive metal layer 4 are combined together both electrically and mechanically, while an ohmic electrode P2 is formed on the upper end of the semiconductor substrate 14.

Here, the laser oscillation section 14 is formed by forming semiconductor thin films consisting of III–V compound semiconductor containing As as group V element and includes a semiconductor multilayer film structure including a double hetero (DH) structure having an active layer of a strained quantum well structure and two clad layers laminated together with the active layer interposed therebetween, also has the above-mentioned ridge waveguide 15 formed in contact with the adhesive metal layer 4.

The semiconductor laser device 1 formed according to the third embodiment shown in FIG. 11A has the same structure as the semiconductor laser device 1 formed according to the above-described second embodiment shown in FIG. 9A. However, the second light emitting element 3B shown in FIG. 11A can be deemed as having a structure in which the semiconductor substrate SUB2 have been removed from the first light emitting element 2A shown in FIG. 9A, while the first light emitting element 2B shown in FIG. 11A can be deemed as having a structure in which the semiconductor substrate 13 is provided on the second light emitting element 3A shown in FIG. 9A.

In addition, the adhesive metal layer 4 and the ohmic electrode layer 17 are partially exposed on the light emitting element 3B whose specific area is smaller than the second light emitting element 2B, while the ohmic electrode P3 is formed on the partially exposed portions.

Namely, the specific area of the laser oscillation section 14 of the second light emitting element 3B secured to the adhesive metal layer 4 is smaller than that of the laser oscillation section 9 of the first light emitting element 2B similarly secured to the adhesive metal layer 4. Due to such a difference between the two specific areas, the adhesive metal layer 4 and the ohmic electrode layer 17 can be seen as having been exposed when viewed from the laser oscillation section 14.

When a driving current is supplied hereto through the ohmic electrodes P1 and P3, an electric current narrowed by the ridge waveguide 10 will flow into the above-mentioned active layer of the laser oscillation section 9, thereby generating a light. Further, the light thus generated and waveguided by the stripe shape of the ridge waveguide 10 is reflected by the cleaved facets (mirror surfaces) formed both at ends in the longitudinal direction of the ridge waveguide 10, while at the same time continuously inducing carrier recombination one after another and effecting an induced emission, thereby allowing the cleaved facets to emit a laser light having a wavelength of about 650 nm.

When a driving current is supplied hereto through the ohmic electrodes P2 and P3, an electric current narrowed by the ridge waveguide 15 will flow into the above-mentioned active layer of the laser oscillation section 14, thereby generating a light. Further, the light thus generated and wave-guided by the stripe shape of the ridge waveguide 15 is reflected by the cleaved facets (mirror facets) formed at both ends in the longitudinal direction of the ridge waveguide 15, while at the same time continuously inducing carrier recombination one after another and effecting an induced emission, thereby allowing the cleaved facets to emit a laser light having a wavelength of about 780 nm.

In addition, one side of each cleavage plane is coated with a highly reflective coating.

Next, a process of manufacturing the semiconductor laser device 1 having the above-mentioned structure will be described in the following with reference to FIG. 12.

At first, an intermediate body 400 for forming a plurality of second light emitting elements 3B (as shown in FIG. 12A which is a cross sectional view) and an intermediate body 200 for forming a plurality of first light emitting elements 2B (as shown in FIG. 12B which is a cross sectional view) are produced in advance.

Namely, as shown in FIG. 12A, MOCVD method or the like is employed to form an etching stop layer STP consisting of InGaP or the like on the semiconductor substrate SUB2 consisting of GaAs. Then, a semiconductor thin films consisting of an AlGaAs-based semiconductor are laminated to form a laser oscillation section 14 including a double hetero (DH) structure having an active layer of a strained quantum well structure and two clad layers laminated together with the active layer interposed therebetween, also including the ridge waveguides 15. Further, an insulating layer 16, an ohmic electrode layer 17 and the adhesive metal layer 4a are successively formed on the laser oscillation section 14, thereby forming the intermediate body 400.

In more detail, the above-mentioned etching stop layer STP and the above-mentioned laser oscillation section 14 are formed on the GaAs (001) semiconductor substrate SUB2, while ridge waveguides 15 are formed in <110> direction. Then, vapor deposition is carried out to form the ohmic electrode layer 17 consisting of either one of Ti, Pt, Cr, Au and Au—Zn, or an alloy containing two or more of these elements, also to form the adhesive metal layer 4a consisting of Au.

On the other hand, the intermediate body 200 shown in FIG. 12B is produced by the same manufacturing process as in the second embodiment shown in FIG. 10B. However, the intermediate body 200 in the present embodiment can be produced without providing an etching stop layer between the semiconductor substrate 13 consisting of GaAs (for example) and the laser oscillation section 9.

Next, as shown in FIG. 12C, the intermediate bodies 200, 400 are combined together by bonding together the adhesive metal layers 4b, 4a (produced in advance) of the intermediate bodies 200,400.

Here, the ridge waveguides 10, 15 of the intermediate bodies 200, 400 are aligned with each other, in a manner such that they face each other at a short distance.

In more detail, the cleavage plane (110) of the laser oscillation section 14 consisting of the III–V compound semiconductor containing As as group V element of the intermediate body 400, is aligned with the cleavage plane (110) of the laser oscillation section 9 consisting of the III–V compound semiconductor containing P or As as group V element of the intermediate body 200, thereby combining together the intermediate bodies 200, 400 in a manner such that the ridge waveguides 10, 15 face each other at a short distance.

Then, the adhesive metal layers 4a and 4b are fused together, followed by removing an added heat therefrom. In this way, as shown in FIG. 12D, the adhesive metal layers 4a and 4b are unified into an integral adhesive metal layer 4 and the intermediate bodies 200, 400 are secured together with the adhesive metal layer 4 interposed therebetween, thereby obtaining an integrally formed intermediate body 500.

Next, in a process shown in FIG. 12E, an etching treatment is carried out to remove the semiconductor substrate SUB2.

More specifically, in order to prevent the semiconductor substrate 13 consisting of GaAs from being etched, the semiconductor substrate 13 is covered with a resist, wax or the like, while an etchant whose ratio of sulfuric acid: hydrogen peroxide water: water is 4:1:1 is used to wet-etch the semiconductor substrate SUB2 from the backside thereof, thereby removing the semiconductor substrate SUB2 only.

Next, in a process shown in FIG. 12F, wet-etching treatment is carried out to partially remove the etching stop layer STP and the insulating layer 16, thereby leaving only some areas for forming a plurality of laser oscillation sections 14. In this way, as shown in FIG. 12B, a plurality of laser oscillation sections 14 each having a convex cross section are formed, while the ohmic electrode layer 17 is exposed in the recess portions R formed among those laser oscillation sections 14.

Next, several pieces of the etching stop layer STP are removed so as to expose the plurality of the laser oscillation sections 14. Subsequently, in the same manner as shown in FIGS. 3A to 3C, the ohmic electrodes P1, P2 and P3 are formed, while cleaving and scribing are performed, thereby producing a plurality of semiconductor laser devices 1 each having the structure shown in FIG. 11A.

More specifically, the ohmic electrodes P1 and P2 are formed on the lower end of the semiconductor substrate 13, and on the exposed ends of the laser oscillation sections 14 formed by removing the semiconductor substrate SUB2 and the etching stop layer STP, using vapor deposition employing either one of Ni, Au and Au—Ge or an alloy containing two or more of these elements.

Thus, according to each semiconductor laser device 1 of the present embodiment, since the laser oscillation sections 9 and 14 can be secured together by interposing therebetween the adhesive metal layer 4 having an extremely small thickness, it is possible to greatly reduce an interval between light emitting spots.

Furthermore, after producing a unified intermediate body 500 formed by securing together the intermediate bodies 200,400 using the adhesive metal layer 4, the intermediate body 500 is divided into a plurality of semiconductor laser devices 1 by means of cleaving and scribing or the like. For this reason, when the intermediate bodies 200,400 are secured together by virtue of the adhesive metal layer 4 during the semiconductor manufacturing process, it is possible to perform in only one step an optimum control of light emitting spot distance in each of the plurality of the semiconductor laser devices 1 to be later formed by dividing the unified intermediate body, and to perform an alignment among light emitting spots with a high precision. Moreover, since it is possible to perform in only one step an optimum control of light emitting spot distance in each semiconductor laser device 1, it is allowed to improve a mass productivity and to ensure a uniform product quality.

Moreover, it has become possible to provide an improved semiconductor laser device suitable to be carried in an optical pickup which performs information recording or information playback on CD, DVD or other storage medium.

In the manufacturing process according to the third embodiment of the present invention, as described with reference to FIG. 12A, the etching stop layer STP is formed in an entire area between the semiconductor substrate SUB2 and the laser oscillation section 14, thereby forming the intermediate body 400. However, as a modification of the present embodiment, it is also possible that the etching stop layer STP may be formed only in some areas between the semiconductor substrate SUB2 and the laser oscillation section 14, merely for forming a plurality of laser oscillation sections 14, thereby similarly producing the intermediate body 400. Then, using the same process as shown in FIGS. 4A to 4C, a plurality of laser oscillation sections 14 each having a convex cross section are formed, while partially exposing the ohmic electrode layer 17.

Next, the semiconductor laser device shown in FIG. 11B will be described in the following. In fact, this semiconductor laser device is formed by securing the semiconductor laser device 1 shown in FIG. 11A on a ceramic support substrate (sub-amount) 3000 having a high thermal conductivity and an electric insulation.

Specifically, in the same manner as the second embodiment shown in FIG. 9B, the semiconductor laser device 1 shown in FIG. 11A is attached to the support substrate 3000.

When a driving current is supplied hereto through the lead wires L11 and L31, the laser oscillation section 14 of the second light emitting element 3B will emit a laser light having a wave-length of 780 nm. On the other hand, when a driving current is supplied hereto through the lead wires L2 and L31, the laser oscillation section 9 of the first light emitting element 2B will emit a laser light having a wave-length of 650 nm.

In this way, if the semiconductor laser device 1 is secured to the support substrate 3000, the heat produced in the laser oscillation section 9 will dissipate towards the support substrate 3000 through the adhesive metal layer 4 and the adhesive metal layer SPC serving as a conductive spacer. Meanwhile, this heat will dissipate towards the support substrate 3000 through the adhesive metal layer 4 and the second light emitting element 3B, thereby ensuring an excellent heat dissipation effect with respect to the first light emitting element 2B.

Moreover, since the second light emitting element 3B has only a thickness of about several micrometers, it is possible to secure together the ohmic electrode layer 12 and the electrode layer P31 both electrically and mechanically, only by fusing and solidifying the adhesive metal layer SPC between the ohmic electrode layer 12 and the electrode layer P31. For this reason, it is not necessary to carry out a process of forming steps in the support substrate 3000 in accordance with the thickness of the second light emitting element 3B.

[Fourth Embodiment]

Figure 13:
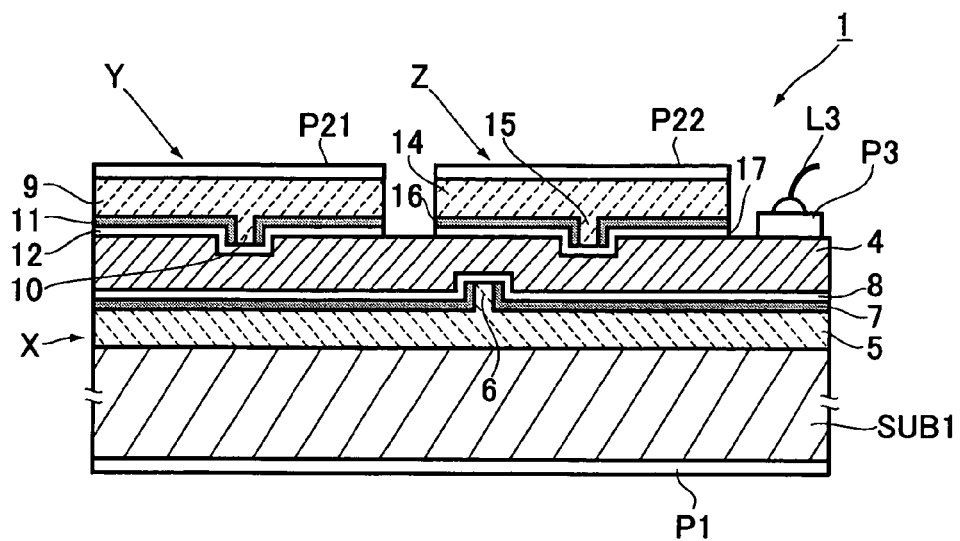
FIGS. 13A and 13B are cross sectional views showing the structure of a semiconductor laser device formed according to a fourth embodiment.
Figure 13:
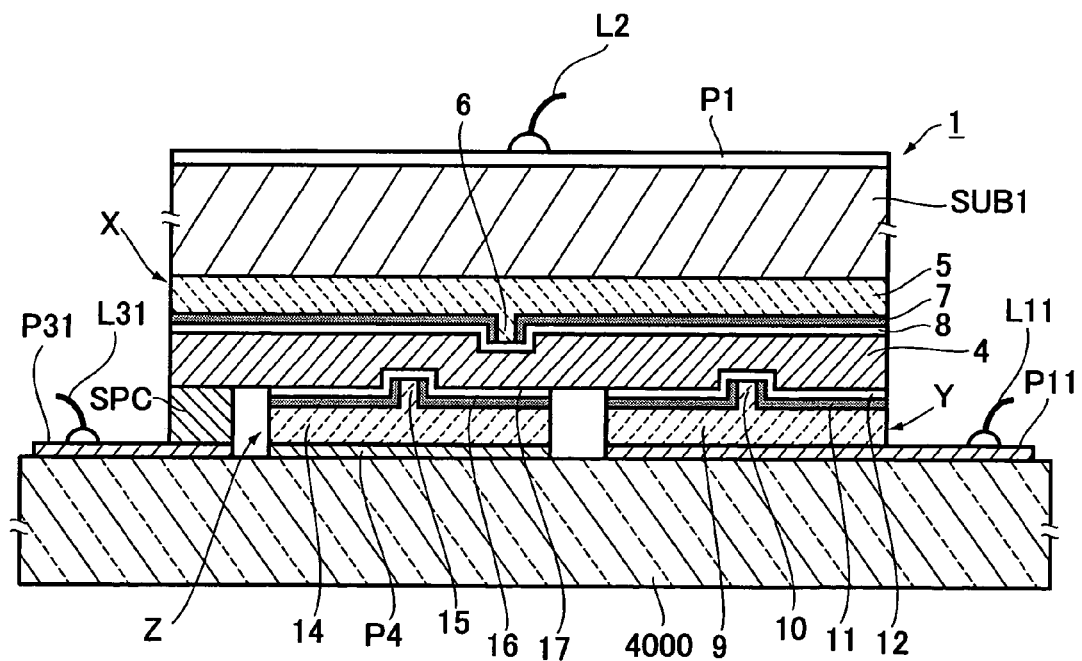
Figure 14:
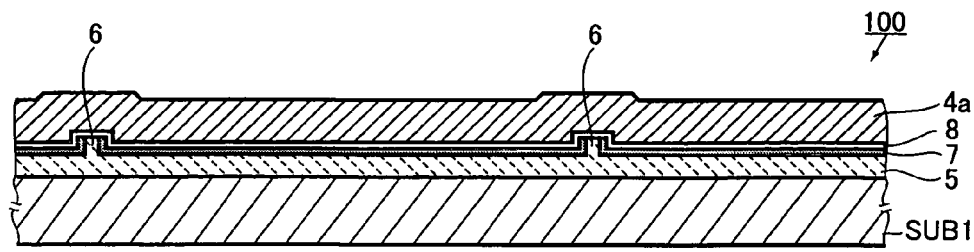
FIGS. 14A–14D are cross sectional views showing a process of manufacturing the semiconductor laser device of the fourth embodiment.
Figure 14:
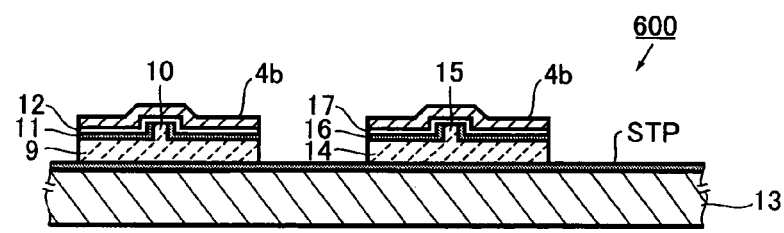
Figure 14:
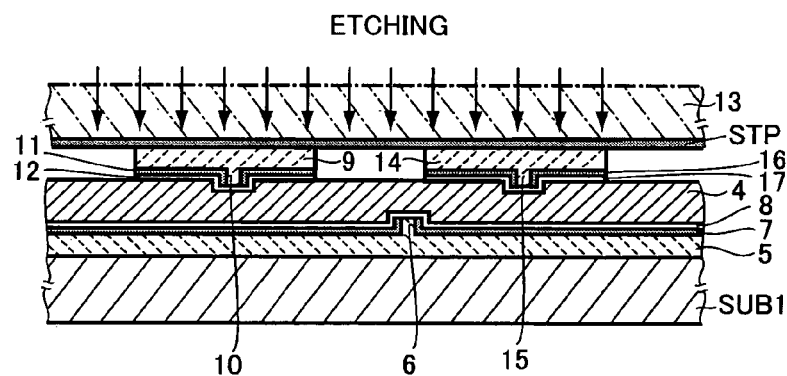
Figure 14:
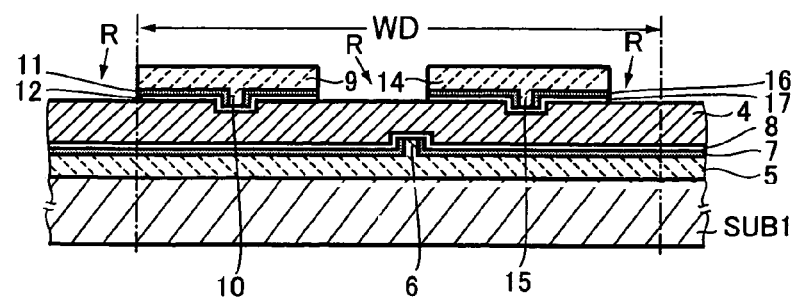

Next, the semiconductor laser device formed according to the fourth embodiment of the present invention will be described with reference to FIG. 13 and FIG. 14. In detail, FIG. 13A is a cross sectional view showing the structure of a semiconductor laser device formed according to the fourth embodiment. FIG. 13B is a cross sectional view showing a sectional configuration of a modified semiconductor laser device formed according to the fourth embodiment. FIG. 14 includes several views showing a process of manufacturing the semiconductor laser device shown in FIG. 13A. However, in FIG. 11 and FIG. 12, elements which are identical as or corresponding to those in FIG. 1, FIG. 2, FIG. 9 and FIG. 11 are represented by the same reference numerals.

The semiconductor laser device 1 shown in FIG. 13A is a three-wavelength laser device capable of emitting three laser beams having different wavelengths, and has a hybrid structure including a first light emitting element X capable of emitting a laser beam having a wavelength of 350–450 nm (more specifically, 405 nm), a second light emitting element Y capable of emitting a laser beam having a wavelength of 600–700 nm (more specifically, 650 nm), and a third light emitting element Z capable of emitting a laser beam having a wavelength of 700–800 nm (more specifically, 780 nm), all of which are integrally secured together by virtue of the adhesive metal layer 4 having a predetermined conductivity.

The first light emitting element X is a GaN-based laser having the same structure as the light emitting element 2 formed on the semiconductor substrate SUB1 shown in FIG. 1B and consisting for example of a III–V nitride compound semiconductor. The second light emitting element Y is an AlGaInP-based laser having the same structure as the light emitting element 3 shown in FIG. 1B. The third light emitting element Z is an AlGaAs-based laser having the same structure as the light emitting element 3B shown in FIG. 11A.

The ohmic electrodes P1, P21 and P22 are respectively formed on the lower end of the semiconductor substrate SUB1, on the upper end of the laser oscillation section 9 forming the light emitting element Y, and on the upper end of the laser oscillation section 14 forming the light emitting element Z.

Furthermore, the ohmic electrode P3 is formed on an exposed portion of the adhesive metal layer 4 exposed to the outside of the second and third light emitting elements Y and Z.

Here, as compared with the specific area of the laser oscillation section 5 of the first light emitting element X secured to the adhesive metal layer 4, the laser oscillation sections 9 and 14 of the second and third light emitting elements Y and Z secured to the adhesive metal layer 4 have smaller specific areas. Due to these differences among these specific areas, the adhesive metal layer 4 is partially exposed.

When a driving current is supplied hereto through the ohmic electrodes P1 and P3, such a current flows through the adhesive metal layer 4, while an electric current narrowed by the ridge waveguide 6 flows into the active layer of the laser oscillation section, thereby generating a light and thus emitting a laser beam having a wavelength of 405 nm, by virtue of the laser resonator constituted by cleaved facets formed on both ends in the longitudinal direction of the ridge waveguide 6.

When a driving current is supplied hereto through the ohmic electrodes P21 and P3, such a current flows through the adhesive metal layer 4, while an electric current narrowed by the ridge waveguide 10 flows into the active layer of the laser oscillation section 9, thereby generating a light and thus emitting a laser beam having a wavelength of 650 nm, by virtue of the laser resonator constituted by cleaved facets formed on both ends in the longitudinal direction of the ridge waveguide 10.

When a driving current is supplied hereto through the ohmic electrodes P22 and P3, such a current flows through the adhesive metal layer 4, while an electric current narrowed by the ridge waveguide 15 flows into the active layer of the laser oscillation section 14, thereby generating a light and thus emitting a laser beam having a wavelength of 780 nm, by virtue of the laser resonator constituted by cleaved facets formed on both ends in the longitudinal direction of the ridge waveguide 15.

Next, a process of manufacturing the semiconductor laser device 1 having the above-described structure will be described with reference to FIG. 14.

First, as shown in FIG. 14A which is a cross sectional view, an intermediate body 100 for forming a plurality of first light emitting elements X is produced in advance. Meanwhile, as shown in FIG. 14B which is also a cross sectional view, an intermediate body 600 for forming a plurality of second and third light emitting elements Y and Z is similarly produced in advance.

In fact, the intermediate body 100 shown in FIG. 14A is produced by the same manufacturing process as shown in FIG. 2A.

On the other hand, as to the intermediate body 600 shown in FIG. 14B, a plurality of pairs of laser oscillation sections 9,14 are formed on the semiconductor substrate 13 consisting for example of GaAs, with mutually adjacent laser oscillation sections 9, 14 serving as one pair.

Namely, MOCVD method or the like is carried out to form an etching stop layer STP consisting of InGaP or the like on the semiconductor substrate 13. Subsequently, lithography method or photography etching method is employed to form, on the etching stop layer STP, the laser oscillation section 9 having a multilayer structure based on AlGaInP-based laser thin films, and the laser oscillation section 14 having a multilayer structure based on AlGaAs-based laser thin films.

However, each pair of laser oscillation sections 9,14 are formed with respect to one ridge waveguide 6 of the intermediate body 100, in a manner such that such one pair of the laser oscillation sections 9,14 are in a specific relation with the ridge waveguide.

Then, the insulating layers 11 and 16, the ohmic electrode layers 12 and 17, and the adhesive metal layers 4b and 4b are respectively formed on the laser oscillation sections 9 and 14, thereby producing the intermediate body 600.

Next, as shown in FIG. 14C, the adhesive metal layers 4a and 4b of the intermediate bodies 100, 600 are combined with each other, thereby combining together the intermediate bodies 100,600.

Here, the ridge waveguide 6 is aligned with each pair of ridge waveguides 10,15 in a manner such that they become parallel with one another. Meanwhile, when the below-mentioned cleaving or the like is carried out to divide the combined intermediate bodies into a plurality of semiconductor laser devices 1, positioning adjustment is beforehand carried out so that the light emitting spots of the laser oscillation sections 5, 9, and 14 of each semiconductor laser device 1 may get close to one another.

More specifically, cleavage plane (1-110) of the laser oscillation section 5 having GaN-based laser thin film, cleavage plane (110) of the laser oscillation section 9 having AlGaInP-based laser thin film, and cleavage plane (110) of the laser oscillation section 16 having AlGaAs-based laser thin film, are aligned with one another, while the ridge waveguides 6, 10, and 15 are also caused to approach one another, thereby combining together the intermediate bodies 100, 600.

Then, the intermediate bodies 100, 600 are entirely heated (more specifically, at a temperature of about 300 □) when being pressed towards each other by a predetermined urging force, while the adhesive metal layer 4a consisting of Sn and the adhesive metal layer 4b consisting of Au are fused together, followed by removing the added heat. In this way, the adhesive metal layers 4a and 4b become into an integrally formed adhesive metal layer 4, thereby combining together the intermediate bodies 100,600 with the adhesive metal layer 4 interposed therebetween.

Furthermore, an etchant whose ratio of sulfuric acid: hydrogen peroxide water: water is 4:1:1 is used to perform a wet-etching treatment on the semiconductor substrate 13 consisting of GaAs from the backside thereof, thereby removing the semiconductor substrate 13

Next, in a process shown in FIG. 14D, the etching stop layer STP is removed so as to expose the laser oscillation sections 9 and 14, and also the adhesive metal layer 4 in the recess portions R formed between the laser oscillation sections 9 and 14.

Next, as shown in FIG. 13A, either one of Ti, Al and Au or an alloy containing two or more of these elements is vapor deposited on the lower end of the semiconductor substrate SUB1. Then, either one of Ni, Au and Au—Ge or an alloy containing two or more of these elements is vapor deposited on the exposed portions of the laser oscillation sections 9 and 14. Subsequently, Au is vapor deposited on the exposed portions of the adhesive metal layer 4. In this way, the ohmic electrodes P1, P21, P22 and P3 can be formed in positions shown in FIG. 13A.

Next, using the same process shown in FIGS. 3A–3C, cleaving and scribing are performed so as to produce a plurality of semiconductor laser devices 1 each having a structure shown in FIG. 13A.

More specifically, cleaving is performed along the cleavage plane (1-100) of the semiconductor substrate SUB1 consisting of GaN, while each cleaved facet is coated with a predetermined dielectric thin film, thereby forming laser resonators. Subsequently, as shown in FIG. 14D, scribing is performed on both sides of a range WD containing one laser oscillation section 5, a pair of laser oscillation sections 9,14 and the ohmic electrode P3 (all corresponding to the laser oscillation section 5), thereby producing a plurality of semiconductor laser devices 1 shown in FIG. 13A.

Thus, with the semiconductor laser device 1 formed according to the present embodiment, since the laser oscillation sections 5, 9 and 14 may be secured together by virtue of an extremely thin adhesive metal layer 4 interposed therebetween, it becomes possible to greatly reduce distance between light emitting spots.

Moreover, after the intermediate bodies 100, 600 are secured together by virtue of the adhesive metal layer 4, cleaving and scribing or the like are performed so as to form a plurality of semiconductor laser devices 1. For this reason, when the intermediate bodies 100,600 are secured together by virtue of the adhesive metal layer 4 during the semiconductor manufacturing process, it is possible to perform in only one step an optimum control of light emitting spot interval in each of the semiconductor laser devices 1 (to be later formed by dividing treatment), and to perform an alignment among the light emitting spots with a high precision. Further, since it is possible to perform in only one step an optimum control of light emitting spot interval, it is possible improve the mass productivity and to ensure a uniform product quality.

Moreover, it has become possible to provide an improved semiconductor laser device suitable to be used in an optical pickup which performs information recording or information playback on CD, DVD or other storage medium.

Next, the semiconductor laser device shown in FIG. 13B will be described in the following. In fact, this semiconductor laser device is formed by securing the semiconductor laser device 1 shown in FIG. 13A on a ceramic support substrate (sub-amount) 4000 having a high thermal conductivity and an electric insulation.

The patterned electrode layers P11, P31 and P4 consisting of a metal such as Cu are formed by vapor deposition on the upper surface of the support substrate 4000.

The laser oscillation section 9 of the second light emitting element Y is secured electrically and mechanically on the electrode layer P11, the laser oscillation section 14 of the third light emitting element Z is secured electrically and mechanically on the electrode layer P4, and the exposed portions of the adhesive metal layer 4 are secured electrically and mechanically on the electrode layer P31 through the adhesive metal layer SPC serving as a conductive spacer. Moreover, the lead wires L11 and L31 for supplying a driving current are connected to the electrode layers P11 and P31. Further, although not shown in the accompanying drawings, the lead wires for supplying a driving current are also connected to the electrode layer P4.

When a driving current is supplied hereto through the lead wire L31 and the ohmic electrode P1, the laser oscillation section 5 of the first light emitting element X emits a laser light having a wavelength of 405 nm (for example). When a driving current is supplied hereto through the lead wires L11 and L31, the laser oscillation section 9 of the second light emitting element Y emits a laser light having a wavelength of 650 nm (for example). When a driving current is supplied hereto through a lead wire (not shown) connected with the electrode layer P4 and also through the lead wire L31, the laser oscillation section 14 of the third light emitting element Z emits a laser light having a wavelength of 780 nm (for example).

With the use of this semiconductor laser device, since the first through third light emitting elements X, Y and Z are secured to the support substrate 4000, the heat produced during the light emission of the laser oscillation sections 5, 9 and 14 is allowed to dissipate outwardly with an increased efficiency.

Furthermore, although the second and third light emitting elements Y and Z have a thickness to some extent, such thickness is in fact as thin as several micrometers. Therefore, the adhesive metal layer 4 and the electrode layer P31 can be secured together both electrically and mechanically only by fusing and solidifying the adhesive metal layer SPC between the adhesive metal layer 4 and the electrode layer P31, thereby simplifying the manufacturing process.

As described in the above first through fourth embodiments as well as in the first and second Examples, the adhesive metal layer 4a is formed by Au and the adhesive metal layer 4b is formed by Sn. However, it is also possible that the adhesive metal layer 4a is formed by Sn and the adhesive metal layer 4b is formed by Au.

Moreover, it is desirable to form Sn diffusion inhibition film such as Pt, TiN and Ir film between the adhesive metal layer consisting of Au and the ohmic electrode of GaN-based laser, or between the adhesive metal layer consisting of Sn and the ohmic electrode of AlGaInP-based laser or that of AlGaAs-based laser.

On the other hand, the above-mentioned adhesive metal layers 4a and 4b are not necessarily to be the combination of Au and Sn, they are also allowed to be a combination of Au and In, a combination of Pd and In, and a combination of Au and Ge. When the adhesive metal layer 4 of an intermetallic compound is produced by fusing these metals, current injection will not be hampered when a driving current is injected into each laser oscillation section, thereby making it possible for a heat generated during laser light emission to be dissipated at an improved efficiency.

In all the above-described embodiments and examples, the adhesive metal layers 4a and 4b serving as adhesion layers having an electric conductivity are fused together to form the adhesive metal layer 4 serving as a unified adhesion layer, thereby making it easy to secure together the respective laser oscillation sections both electrically and mechanically by virtue of the adhesive metal layer 4. However, it is not absolutely necessary to use such kind of fusion. In fact, it is also possible to achieve such an adhesion by making use of solid phase diffusion below the melting temperature of the adhesion layer.

If so, both adhesion layers may be formed by Au, pressed towards each other and heated without fusing Au, thereby effecting the desired adhesion by virtue of solid phase diffusion.

Moreover, the afore-mentioned electrode layers and ohmic electrodes are not absolutely necessary to be formed by the above-listed materials, but can be formed by any other materials, provided that they provide an ohmic contact with each semiconductor surface.

Further, as long as the ohmic electrodes P1, P2, P3, P11, P31, P21 and P22 are formed by materials which can provide good ohmic contact, these ohmic electrodes can also be formed by some other materials without having to be limited by the above-described embodiments and examples.

Besides, the first light emitting section 2 shown in FIG. 1, FIG. 5, FIG. 11 and FIG. 13 as well as the material forming the semiconductor substrate SUB1 provided on X side may also be either group-III nitride semiconductor containing at least nitrogen (N), or silicon carbide (SiC).

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A semiconductor laser device for emitting a plurality of laser beams having different wavelengths, said device comprising:
   a first laser oscillation section having a plurality of first semiconductor films formed on a semiconductor substrate and having a predetermined specific area; and
   a second laser oscillation section having a plurality of second semiconductor films and having a smaller specific area than the first laser oscillation section,
   wherein the first laser oscillation section's one surface located away from the semiconductor substrate and the second laser oscillation section's one surface located close to its light emitting portion are bonded together by virtue of an adhesion layer having an electric conductivity,
   wherein the second laser oscillation section includes III–V compound semiconductor containing any one of arsenic (As), phosphorus (P) and antimony (Sb) as group V element or II–VI compound semiconductor,
   wherein said adhesion layer contains metal component and serves as a common electrode for said laser oscillation sections,
   wherein said semiconductor laser device further comprises a metal-diffusion preventing film for preventing metal diffusion between said adhesion layer and at least one of said semiconductor films.

2. The semiconductor laser device according to claim 1, further including an electrically conductive layer electrically connected with the adhesion layer on an exposed portion of the first laser oscillation section which has been formed due to specific area difference between the first and second laser oscillation sections and can be viewed from the second laser oscillation section side, while connected and exposed surface portion of the electrically conductive layer serves as an electric current supply section for supplying a driving current to drive the first and second laser oscillation sections.

3. The semiconductor laser device according to claim 1 or 2, wherein the semiconductor substrate is formed by group-III nitride semiconductor containing at least nitrogen (N), or formed by silicon carbide (SiC).

4. The semiconductor laser device according to claim 3, wherein the first laser oscillation section includes a semiconductor containing at least nitrogen (N).

5. The semiconductor laser device according to claim 1 or 2, wherein the semiconductor substrate is formed by gallium arsenide (GaAs).

6. The semiconductor laser device according to claim 5, wherein the first laser oscillation section includes III–V compound semiconductor containing any one of arsenic (As), phosphorus (P) and antimony (Sb) as group V element or II–VI compound semiconductor.

7. The semiconductor laser device according to claim 3, wherein the second laser oscillation section is a semiconductor laser including a semiconductor containing at least phosphorus (P) in its active layer and for emitting a light having a wavelength of 650 nm.

8. The semiconductor laser device according to claim 3, wherein the second laser oscillation section is a semiconductor laser including a semiconductor containing at least arsenic (As) in its active layer and for emitting a light having a wavelength of 780 nm.

9. The semiconductor laser device according to claim 5, wherein the first laser oscillation section is a semiconductor laser including a semiconductor containing at least arsenic (As) in its active layer and for emitting a light having a wavelength of 780 nm, while the second laser oscillation section is a semiconductor laser including a semiconductor containing at least phosphorus (P) in its active layer and for emitting a light having a wavelength of 650 nm.

10. The semiconductor laser device according to claim 5, wherein the first laser oscillation section is a semiconductor laser including a semiconductor containing at least phosphorus (P) in its active layer and for emitting a light having a wavelength of 650 nm, while the second laser oscillation section is a semiconductor laser including a semiconductor containing at least arsenic (As) in its active layer and for emitting a light having a wavelength of 780 nm.

11. The semiconductor laser device according to claim 7, further comprising a third laser oscillation section having a smaller specific area than said exposed portion, including a semiconductor containing at least arsenic (As) in its active layer, and capable of emitting a light having a wavelength of 780 nm, which third laser oscillation section is bonded on said exposed portion by virtue of the adhesion layer.

12. The semiconductor laser device according to claim 7, further comprising a third laser oscillation section having a smaller specific area than the second laser oscillation section, including a semiconductor containing at least arsenic (As) in its active layer, and for emitting a light having a wavelength of 780 nm, which third laser oscillation section is bonded through the adhesion layer on the second oscillation section's one surface located away from the first laser oscillation section.

13. The semiconductor laser device according to claim 1, wherein a support substrate having a high thermal conductivity and an electric insulation is provided on the second laser oscillation section side.

14. The semiconductor laser device according to claim 11, wherein a support substrate having a high thermal conductivity and an electric insulation is provided on the side of the second and third laser oscillation sections.

15. A method of manufacturing a semiconductor laser device capable of emitting a plurality of laser beams having different wavelengths, said method comprising the steps of:
   forming a plurality of semiconductor films on a first semiconductor substrate to form a first laser oscillation section, then forming a first adhesion layer having an electric conductivity on the first laser oscillation section, thereby forming a first intermediate body;
   forming an etching stop layer on a second semiconductor substrate, while at the same time forming a plurality of semiconductor films on the etching stop layer to form a second laser oscillation section, followed by forming a second adhesion layer having an electric conductivity on the second laser oscillation section, thereby forming a second intermediate body;
   bonding together the first adhesion layer and the second adhesion layer to form a third intermediate body in which the first laser oscillation section and the second laser oscillation section have been bonded together;
   performing an etching treatment on the third intermediate body to remove the second semiconductor substrate portion from the third intermediate body, and to remove portions of the second laser oscillation section except portions in which waveguide is formed, thereby forming a plurality of second laser oscillation sections; and
   removing remaining portions of the etching stop layer, followed by cleaving the third intermediate body and dividing the third intermediate body along recess portions formed on both sides of each of the second laser oscillation sections, thereby forming a plurality of semiconductor laser devices each including a first laser oscillation section and a second laser oscillation section which are secured together with the adhesion layer interposed therebetween, wherein each adhesion layer contains metal component and serves as a common electrode for said laser oscillation sections, wherein said method further comprises a step of forming at least one metal-diffusion preventing film for preventing diffusion of metal before forming any one of said adhesion layers.

16. The method according to claim 15, wherein the first laser oscillation section is formed by forming semiconductor films containing at least nitrogen (N).

17. The method according to claim 16, wherein the second laser oscillation section is formed by forming semiconductor films including an active layer consisting of a semiconductor film containing at least phosphorus (P).

18. The method according to claim 16, wherein the second laser oscillation section is formed by forming semiconductor films including an active layer consisting of a semiconductor film containing at least arsenic (As).

19. The method according to claim 15, wherein the first laser oscillation section is formed by forming semiconductor films including an active layer consisting of a semiconductor film containing at least phosphorus (P), while the second laser oscillation section is formed by forming semiconductor films including an active layer consisting of a semiconductor film containing at least arsenic (As).

20. The method according to claim 15, wherein the first laser oscillation section is formed by forming semiconductor films including an active layer consisting of a semiconductor film containing at least arsenic (As), while the second laser oscillation section is formed by forming semiconductor films including an active layer consisting of a semiconductor film containing at least phosphorus (P).

21. A method of manufacturing a semiconductor laser device capable of emitting a plurality of laser beams having different wavelengths, said method comprising the steps of:

forming a plurality of semiconductor films on a first semiconductor substrate to form a first laser oscillation section, while at the same time forming a first adhesion layer having an electric conductivity on the first laser oscillation section, thereby forming a first intermediate body;

forming an etching stop layer on a second semiconductor substrate, then forming a plurality of semiconductor films on the etching stop layer to form a second laser oscillation section, while at the same time forming a plurality of semiconductor films to form a third laser oscillation section, thereby forming second and third laser oscillation sections in mutually separated positions, followed by forming a second adhesion layer having an electric conductivity on the second and third laser oscillation sections, thereby forming a second intermediate body;

bonding together the first adhesion layer and the second adhesion layer to form a third intermediate body in which the first, second and third laser oscillation sections have been bonded together;

performing an etching treatment on the third intermediate body to remove the second semiconductor substrate portion from the third intermediate body, and to remove portions of the second and third laser oscillation sections except portions in which waveguides are formed, thereby forming a plurality of second and third laser oscillation sections; and removing remaining portions of the etching stop layer, followed by cleaving the third intermediate body and dividing the third intermediate body along recess portions formed on both sides of each of the second and third laser oscillation sections, thereby forming a plurality of semiconductor laser devices each including a first laser oscillation section, a second laser oscillation section and a third laser oscillation section which are secured together with the adhesion layers interposed therebetween, wherein each adhesion layer contains metal component and serves as a common electrode for said laser oscillation sections, wherein said method further comprises a step of forming at least one metal-diffusion preventing film for preventing diffusion of metal before forming any one of said adhesion layers.

22. The semiconductor laser device according to claim 15, wherein a support substrate having a high thermal conductivity and an electric insulation is provided on the second laser oscillation section side.

23. The semiconductor laser device according to claim 21, wherein a support substrate having a high thermal conductivity and an electric insulation is provided on the side of the second and third laser oscillation sections.

24. The semiconductor laser device according to claim 1, wherein said metal-diffusion preventing film comprises Pt, TiN or Ir.

25. The method according to claim 15, wherein said metal-diffusion preventing film comprises Pt, TiN or Ir.

26. The method according to claim 21, wherein said metal-diffusion preventing film comprises Pt, TiN or Ir.

27. The semiconductor laser device according to claim 4, wherein the second laser oscillation section is a semiconductor laser including a semiconductor containing at least phosphorus (P) in its active layer and for emitting a light having a wavelength of 650 nm.

28. The semiconductor laser device according to claim 4, wherein the second laser oscillation section is a semiconductor laser including a semiconductor containing at least arsenic (As) in its active layer and for emitting a light having a wavelength of 780 nm.

29. The semiconductor laser device according to claim 27, further comprising a third laser oscillation section having a smaller specific area than said exposed portion, including a semiconductor containing at least arsenic (As) in its active layer, and capable of emitting a light having a wavelength of 780 nm, which third laser oscillation section is bonded on said exposed portion by virtue of the adhesion layer.

30. The semiconductor laser device according to claim 27, further comprising a third laser oscillation section having a smaller specific area than the second laser oscillation section, including a semiconductor containing at least arsenic (As) in its active layer, and for emitting a light having a wavelength of 780 nm, which third laser oscillation section is bonded through the adhesion layer on the second oscillation section's one surface located away from the first laser oscillation section.

31. The semiconductor laser device according to claim 29, wherein a support substrate having a high thermal conductivity and an electric insulation is provided on the side of the second and third laser oscillation sections.

32. The semiconductor laser device according to claim 30, wherein a support substrate having a high thermal conductivity and an electric insulation is provided on the side of the second and third laser oscillation sections.

* * * * *